(12) United States Patent
Bower et al.

(10) Patent No.: US 10,468,398 B2
(45) Date of Patent: *Nov. 5, 2019

(54) EFFICIENTLY MICRO-TRANSFER PRINTING MICRO-SCALE DEVICES ONTO LARGE-FORMAT SUBSTRATES

(71) Applicant: X-Celeprint Limited, Cork (IE)

(72) Inventors: Christopher Bower, Raleigh, NC (US); Matthew Meitl, Durham, NC (US)

(73) Assignee: X-Celeprint Limited, Cork (IE)

(*) Notice: Subject to any disclaimer, the term of this patent is extended or adjusted under 35 U.S.C. 154(b) by 0 days.

This patent is subject to a terminal disclaimer.

(21) Appl. No.: 16/227,343

(22) Filed: Dec. 20, 2018

(65) Prior Publication Data

US 2019/0221552 A1    Jul. 18, 2019

Related U.S. Application Data

(63) Continuation of application No. 15/440,756, filed on Feb. 23, 2017, now Pat. No. 10,217,730.

(Continued)

(51) Int. Cl.
*H01L 25/16* (2006.01)
*H01L 25/075* (2006.01)
(Continued)

(52) U.S. Cl.
CPC ...... *H01L 25/167* (2013.01); *H01L 21/67144* (2013.01); *H01L 21/6835* (2013.01);
(Continued)

(58) Field of Classification Search
CPC ............. H01L 2924/14; H01L 25/0753; H01L 21/6835; H01L 33/62; H01L 2221/68354;
(Continued)

(56) References Cited

U.S. PATENT DOCUMENTS

| 4,322,735 A | 3/1982 | Sadamasa et al. |
| 4,330,329 A | 5/1982 | Hayashi et al. |

(Continued)

FOREIGN PATENT DOCUMENTS

| EP | 1548571 A1 | 6/2005 |
| GB | 2 496 183 A | 5/2013 |

(Continued)

OTHER PUBLICATIONS

Machine translation of Aoki et al (JP2014-090122 A) May 15, 2014, 22 pages.*

(Continued)

*Primary Examiner* — Caridad Everhart
(74) *Attorney, Agent, or Firm* — William R. Haulbrook; Michael D. Schmitt; Choate, Hall & Stewart LLP

(57) ABSTRACT

A method of making a micro-transfer printed system includes providing a source wafer having a plurality of micro-transfer printable source devices arranged at a source spatial density; providing an intermediate wafer having a plurality of micro-transfer printable intermediate supports arranged at an intermediate spatial density less than or equal to the source spatial density; providing a destination substrate; micro-transfer printing the source devices from the source wafer to the intermediate supports of the intermediate wafer with a source stamp having a plurality of posts at a source transfer density to make an intermediate device on each intermediate support; and micro-transfer printing the intermediate devices from the intermediate wafer to the destination substrate at a destination spatial density less than the source spatial density with an intermediate stamp having a plurality of posts at an intermediate transfer density less than the source transfer density.

21 Claims, 7 Drawing Sheets

Related U.S. Application Data

(60) Provisional application No. 62/300,040, filed on Feb. 25, 2016.

(51) Int. Cl.
   *H01L 33/62* (2010.01)
   *H01L 33/00* (2010.01)
   *H01L 23/00* (2006.01)
   *H01L 21/67* (2006.01)
   *H01L 21/683* (2006.01)

(52) U.S. Cl.
   CPC .......... *H01L 24/97* (2013.01); *H01L 25/0753* (2013.01); *H01L 33/62* (2013.01); H01L 33/0095 (2013.01); H01L 2221/68354 (2013.01); H01L 2221/68368 (2013.01); H01L 2221/68381 (2013.01); H01L 2224/24227 (2013.01); H01L 2224/82007 (2013.01); H01L 2224/951 (2013.01); H01L 2224/95136 (2013.01); H01L 2924/12041 (2013.01); H01L 2924/12044 (2013.01); H01L 2924/14 (2013.01); H01L 2924/1815 (2013.01); H01L 2924/18162 (2013.01); H01L 2933/0066 (2013.01)

(58) Field of Classification Search
   CPC .............. H01L 24/97; H01L 2933/0066; H01L 2933/0016
   See application file for complete search history.

(56) References Cited

U.S. PATENT DOCUMENTS

| | | | |
|---|---|---|---|
| 4,591,659 A | 5/1986 | Leibowitz | |
| 5,173,759 A | 12/1992 | Anzaki et al. | |
| 5,550,066 A | 8/1996 | Tang et al. | |
| 5,563,470 A | 10/1996 | Li | |
| 5,621,555 A | 4/1997 | Park | |
| 5,625,202 A | 4/1997 | Chai | |
| 5,629,132 A | 5/1997 | Suzuki et al. | |
| 5,686,790 A | 11/1997 | Curtin et al. | |
| 5,739,800 A | 4/1998 | Lebby et al. | |
| 5,748,161 A | 5/1998 | Lebby et al. | |
| 5,780,933 A | 7/1998 | Ohmori et al. | |
| 5,815,303 A | 9/1998 | Berlin | |
| 5,821,571 A | 10/1998 | Lebby et al. | |
| 5,994,722 A | 11/1999 | Averbeck et al. | |
| 6,025,730 A | 2/2000 | Akram et al. | |
| 6,084,579 A | 7/2000 | Hirano | |
| 6,087,680 A | 7/2000 | Gramann et al. | |
| 6,142,358 A | 11/2000 | Cohn et al. | |
| 6,143,672 A | 11/2000 | Ngo et al. | |
| 6,169,294 B1 | 1/2001 | Biing-Jye et al. | |
| 6,184,477 B1 | 2/2001 | Tanahashi | |
| 6,278,242 B1 | 8/2001 | Cok et al. | |
| 6,392,292 B1 | 5/2002 | Morishita | |
| 6,392,340 B2 | 5/2002 | Yoneda et al. | |
| 6,403,985 B1 | 6/2002 | Fan et al. | |
| 6,410,942 B1 | 6/2002 | Thibeault et al. | |
| 6,422,716 B2 | 7/2002 | Henrici et al. | |
| 6,424,028 B1 | 7/2002 | Dickinson | |
| 6,466,281 B1 | 10/2002 | Huang et al. | |
| 6,504,180 B1 | 1/2003 | Heremans et al. | |
| 6,577,367 B2 | 6/2003 | Kim | |
| 6,660,457 B1 | 12/2003 | Imai et al. | |
| 6,703,780 B2 | 3/2004 | Shiang et al. | |
| 6,717,560 B2 | 4/2004 | Cok et al. | |
| 6,756,576 B1 | 6/2004 | McElroy et al. | |
| 6,812,637 B2 | 11/2004 | Cok et al. | |
| 6,825,559 B2 | 11/2004 | Mishra et al. | |
| 6,828,724 B2 | 12/2004 | Burroughes | |
| 6,853,411 B2 | 2/2005 | Freidhoff et al. | |
| 6,897,855 B1 | 5/2005 | Matthies et al. | |
| 6,933,532 B2 | 8/2005 | Arnold et al. | |
| 6,936,855 B1 | 8/2005 | Harrah | |
| 6,969,624 B2 | 11/2005 | Iwafuchi et al. | |
| 6,975,369 B1 | 12/2005 | Burkholder | |
| 7,009,220 B2 | 3/2006 | Oohata | |
| 7,012,382 B2 | 3/2006 | Cheang et al. | |
| 7,091,523 B2 | 8/2006 | Cok et al. | |
| 7,098,589 B2 | 8/2006 | Erchak et al. | |
| 7,127,810 B2 | 10/2006 | Kasuga et al. | |
| 7,129,457 B2 | 10/2006 | McElroy et al. | |
| 7,169,652 B2 | 1/2007 | Kimura | |
| 7,195,733 B2 | 3/2007 | Rogers et al. | |
| 7,259,391 B2 | 8/2007 | Liu et al. | |
| 7,288,753 B2 | 10/2007 | Cok | |
| 7,394,194 B2 | 7/2008 | Cok | |
| 7,402,951 B2 | 7/2008 | Cok | |
| 7,420,221 B2 | 9/2008 | Nagai | |
| 7,466,075 B2 | 12/2008 | Cok et al. | |
| 7,479,731 B2 | 1/2009 | Udagawa | |
| 7,521,292 B2 | 4/2009 | Rogers et al. | |
| 7,557,367 B2 | 7/2009 | Rogers et al. | |
| 7,586,497 B2 | 9/2009 | Boroson et al. | |
| 7,605,053 B2 | 10/2009 | Couillard et al. | |
| 7,605,452 B2 | 10/2009 | Yamanaka et al. | |
| 7,622,367 B1 | 11/2009 | Nuzzo et al. | |
| 7,662,545 B2 | 2/2010 | Nuzzo et al. | |
| 7,687,812 B2 | 3/2010 | Louwsma et al. | |
| 7,704,684 B2 | 4/2010 | Rogers et al. | |
| 7,791,271 B2 | 9/2010 | Cok et al. | |
| 7,799,699 B2 | 9/2010 | Nuzzo et al. | |
| 7,816,856 B2 | 10/2010 | Cok et al. | |
| 7,834,541 B2 | 11/2010 | Cok | |
| 7,893,612 B2 | 2/2011 | Cok | |
| 7,919,342 B2 | 4/2011 | Cok | |
| 7,927,976 B2 | 4/2011 | Menard | |
| 7,932,123 B2 | 4/2011 | Rogers et al. | |
| 7,943,491 B2 | 5/2011 | Nuzzo et al. | |
| 7,969,085 B2 | 6/2011 | Cok | |
| 7,972,875 B2 | 7/2011 | Rogers et al. | |
| 7,982,296 B2 | 7/2011 | Nuzzo et al. | |
| 7,990,058 B2 | 8/2011 | Cok et al. | |
| 7,999,454 B2 | 8/2011 | Winters et al. | |
| 8,029,139 B2 | 10/2011 | Ellinger et al. | |
| 8,039,847 B2 | 10/2011 | Nuzzo et al. | |
| 8,198,621 B2 | 6/2012 | Rogers et al. | |
| 8,207,547 B2 | 6/2012 | Lin | |
| 8,243,027 B2 | 8/2012 | Hotelling et al. | |
| 8,261,660 B2 | 9/2012 | Menard | |
| 8,288,843 B2 | 10/2012 | Kojima et al. | |
| 8,333,860 B1 * | 12/2012 | Bibl .................. | H01L 21/67144 156/249 |
| 8,334,545 B2 | 12/2012 | Levermore et al. | |
| 8,394,706 B2 | 3/2013 | Nuzzo et al. | |
| 8,440,546 B2 | 5/2013 | Nuzzo et al. | |
| 8,450,927 B2 | 5/2013 | Lenk et al. | |
| 8,470,701 B2 | 6/2013 | Rogers et al. | |
| 8,502,192 B2 | 8/2013 | Kwak et al. | |
| 8,506,867 B2 | 8/2013 | Menard | |
| 8,519,543 B1 | 8/2013 | Song et al. | |
| 8,531,642 B2 | 9/2013 | Kiryuschev et al. | |
| 8,558,243 B2 | 10/2013 | Bibl et al. | |
| 8,605,452 B2 | 12/2013 | Tang | |
| 8,664,699 B2 | 3/2014 | Nuzzo et al. | |
| 8,686,447 B2 | 4/2014 | Tomoda et al. | |
| 8,722,458 B2 | 5/2014 | Rogers et al. | |
| 8,735,932 B2 | 5/2014 | Kim et al. | |
| 8,754,396 B2 | 6/2014 | Rogers et al. | |
| 8,766,970 B2 | 7/2014 | Chien et al. | |
| 8,791,474 B1 | 7/2014 | Bibl et al. | |
| 8,794,501 B2 | 8/2014 | Bibl et al. | |
| 8,803,857 B2 | 8/2014 | Cok | |
| 8,817,369 B2 | 8/2014 | Daiku | |
| 8,835,940 B2 | 9/2014 | Hu et al. | |
| 8,854,294 B2 | 10/2014 | Sakariya | |
| 8,860,051 B2 | 10/2014 | Fellows et al. | |
| 8,877,648 B2 | 11/2014 | Bower et al. | |
| 8,884,844 B2 | 11/2014 | Yang et al. | |
| 8,889,485 B2 | 11/2014 | Bower | |
| 8,895,406 B2 | 11/2014 | Rogers et al. | |

(56) References Cited

U.S. PATENT DOCUMENTS

| | | |
|---|---|---|
| 8,902,152 B2 | 12/2014 | Bai et al. |
| 8,946,760 B2 | 2/2015 | Kim |
| 8,987,765 B2 | 3/2015 | Bibl et al. |
| 9,105,813 B1 | 8/2015 | Chang |
| 9,142,468 B2 | 9/2015 | Bower et al. |
| 9,153,171 B2 | 10/2015 | Sakariya et al. |
| 9,161,448 B2 | 10/2015 | Menard et al. |
| 9,178,123 B2 | 11/2015 | Sakariya et al. |
| 9,202,996 B2 | 12/2015 | Orsley et al. |
| 9,217,541 B2 | 12/2015 | Bathurst et al. |
| 9,308,649 B2 | 4/2016 | Golda et al. |
| 9,355,854 B2 | 5/2016 | Meitl et al. |
| 9,358,775 B2 | 6/2016 | Bower et al. |
| 9,368,683 B1 | 6/2016 | Meitl et al. |
| 9,437,782 B2 | 9/2016 | Bower et al. |
| 9,444,015 B2 | 9/2016 | Bower et al. |
| 9,478,583 B2 | 10/2016 | Hu et al. |
| 9,484,504 B2 | 11/2016 | Bibl et al. |
| 9,496,155 B2 | 11/2016 | Menard et al. |
| 9,520,537 B2 | 12/2016 | Bower et al. |
| 9,537,069 B1 | 1/2017 | Bower et al. |
| 9,555,644 B2 | 1/2017 | Rogers et al. |
| 9,601,356 B2 | 3/2017 | Bower et al. |
| 9,626,908 B2 | 4/2017 | Sakariya et al. |
| 9,640,715 B2 | 5/2017 | Bower et al. |
| 9,741,785 B2 | 8/2017 | Bower et al. |
| 9,761,754 B2 | 9/2017 | Bower et al. |
| 9,899,329 B2 | 2/2018 | Bower |
| 9,899,465 B2 | 2/2018 | Bower et al. |
| 10,008,465 B2 | 6/2018 | Bower |
| 10,181,507 B2 | 1/2019 | Bower et al. |
| 2001/0022564 A1 | 9/2001 | Youngquist et al. |
| 2002/0096994 A1 | 7/2002 | Iwafuchi et al. |
| 2003/0211649 A1 | 11/2003 | Hirai et al. |
| 2004/0114061 A1* | 6/2004 | Kimura ............ H01L 21/67011 349/45 |
| 2004/0180476 A1 | 9/2004 | Kazlas et al. |
| 2004/0212296 A1 | 10/2004 | Nakamura et al. |
| 2004/0224061 A1* | 11/2004 | Mori .................. A23B 4/06 426/321 |
| 2004/0227704 A1 | 11/2004 | Wang et al. |
| 2004/0252933 A1 | 12/2004 | Sylvester et al. |
| 2005/0006657 A1 | 1/2005 | Terashita |
| 2005/0012076 A1 | 1/2005 | Morioka |
| 2005/0116324 A1 | 6/2005 | Yamaguchi |
| 2005/0116621 A1 | 6/2005 | Bellmann et al. |
| 2005/0140275 A1 | 6/2005 | Park |
| 2005/0168987 A1 | 8/2005 | Tamaoki et al. |
| 2005/0202595 A1 | 9/2005 | Yonehara et al. |
| 2005/0264472 A1 | 12/2005 | Rast |
| 2005/0275615 A1 | 12/2005 | Kahen et al. |
| 2005/0285246 A1 | 12/2005 | Haba et al. |
| 2006/0051900 A1 | 3/2006 | Shizuno |
| 2006/0055864 A1 | 3/2006 | Matsumura et al. |
| 2006/0063309 A1 | 3/2006 | Sugiyama et al. |
| 2006/0116046 A1 | 6/2006 | Morley et al. |
| 2007/0035340 A1 | 2/2007 | Kimura |
| 2007/0077349 A1 | 4/2007 | Newman et al. |
| 2007/0201056 A1 | 8/2007 | Cok et al. |
| 2007/0235849 A1 | 10/2007 | Othieno et al. |
| 2008/0006843 A1 | 1/2008 | Dai et al. |
| 2008/0108171 A1 | 5/2008 | Rogers et al. |
| 2008/0211734 A1 | 9/2008 | Huitema et al. |
| 2008/0224153 A1 | 9/2008 | Tomoda |
| 2008/0224254 A1 | 9/2008 | Couillard et al. |
| 2009/0023243 A1 | 1/2009 | Koyanagi |
| 2009/0053498 A1 | 2/2009 | Matsuura et al. |
| 2009/0278141 A1 | 11/2009 | Coe-Sullivan et al. |
| 2009/0278142 A1 | 11/2009 | Watanabe et al. |
| 2009/0315054 A1 | 12/2009 | Kim et al. |
| 2010/0060553 A1 | 3/2010 | Zimmerman et al. |
| 2010/0078670 A1 | 4/2010 | Kim et al. |
| 2010/0123134 A1 | 5/2010 | Nagata |
| 2010/0123268 A1 | 5/2010 | Menard |
| 2010/0148198 A1 | 6/2010 | Sugizaki et al. |
| 2010/0186883 A1 | 7/2010 | Tomoda |
| 2010/0190293 A1 | 7/2010 | Maeda et al. |
| 2010/0207852 A1 | 8/2010 | Cok |
| 2010/0214247 A1 | 8/2010 | Tang et al. |
| 2010/0248484 A1 | 9/2010 | Bower et al. |
| 2010/0258710 A1 | 10/2010 | Wiese et al. |
| 2010/0264816 A1 | 10/2010 | Cok |
| 2010/0289115 A1 | 11/2010 | Akiyama et al. |
| 2010/0315319 A1 | 12/2010 | Cok et al. |
| 2010/0317132 A1 | 12/2010 | Rogers et al. |
| 2011/0043435 A1 | 2/2011 | Hebenstreit et al. |
| 2011/0067911 A1 | 3/2011 | Ishikawa et al. |
| 2011/0108800 A1 | 5/2011 | Pan |
| 2011/0133324 A1 | 6/2011 | Fan et al. |
| 2011/0147715 A1 | 6/2011 | Rogers et al. |
| 2011/0211348 A1 | 9/2011 | Kim |
| 2011/0244225 A1 | 10/2011 | Hattori et al. |
| 2012/0009738 A1 | 1/2012 | Crawford et al. |
| 2012/0080692 A1 | 4/2012 | Ohtorii |
| 2012/0119249 A1 | 5/2012 | Kim et al. |
| 2012/0141799 A1 | 6/2012 | Kub et al. |
| 2012/0223636 A1 | 9/2012 | Shin et al. |
| 2012/0223875 A1 | 9/2012 | Lau et al. |
| 2012/0228669 A1 | 9/2012 | Bower et al. |
| 2012/0256163 A1 | 10/2012 | Yoon et al. |
| 2012/0313241 A1 | 12/2012 | Bower |
| 2012/0314388 A1 | 12/2012 | Bower et al. |
| 2012/0319563 A1 | 12/2012 | Ishihara et al. |
| 2012/0320581 A1 | 12/2012 | Rogers et al. |
| 2013/0015483 A1 | 1/2013 | Shimokawa et al. |
| 2013/0036928 A1 | 2/2013 | Rogers et al. |
| 2013/0069275 A1 | 3/2013 | Menard et al. |
| 2013/0088416 A1 | 4/2013 | Smith et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0248829 A1* | 9/2013 | Smith ................ H01L 51/0031 257/40 |
| 2013/0249138 A1 | 9/2013 | DeSimone et al. |
| 2013/0273695 A1* | 10/2013 | Menard ............ H01L 21/6835 438/118 |
| 2013/0309792 A1 | 11/2013 | Tischler et al. |
| 2013/0328190 A1 | 12/2013 | Wu et al. |
| 2013/0333094 A1 | 12/2013 | Rogers et al. |
| 2014/0084482 A1 | 3/2014 | Hu et al. |
| 2014/0104243 A1 | 4/2014 | Sakariya et al. |
| 2014/0138543 A1 | 5/2014 | LaVeigne |
| 2014/0146273 A1 | 5/2014 | Kim et al. |
| 2014/0159043 A1 | 6/2014 | Sakariya et al. |
| 2014/0159065 A1 | 6/2014 | Hu et al. |
| 2014/0159066 A1 | 6/2014 | Hu et al. |
| 2014/0175498 A1 | 6/2014 | Lai |
| 2014/0183446 A1 | 7/2014 | Nago et al. |
| 2014/0217448 A1 | 8/2014 | Kim et al. |
| 2014/0231839 A1 | 8/2014 | Jeon et al. |
| 2014/0231851 A1 | 8/2014 | Tsai et al. |
| 2014/0264763 A1 | 9/2014 | Meitl et al. |
| 2014/0267683 A1 | 9/2014 | Bibl et al. |
| 2014/0306248 A1 | 10/2014 | Ahn et al. |
| 2014/0319486 A1 | 10/2014 | Hong |
| 2014/0367633 A1 | 12/2014 | Bibl et al. |
| 2014/0367705 A1 | 12/2014 | Bibl et al. |
| 2015/0135525 A1 | 5/2015 | Bower |
| 2015/0137153 A1 | 5/2015 | Bibl et al. |
| 2015/0169011 A1 | 6/2015 | Bibl et al. |
| 2015/0263066 A1 | 9/2015 | Hu et al. |
| 2015/0280066 A1 | 10/2015 | Fujimura et al. |
| 2015/0280089 A1 | 10/2015 | Obata et al. |
| 2015/0318328 A1 | 11/2015 | Bibl et al. |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0372187 A1 | 12/2015 | Bower et al. |
| 2015/0372393 A1 | 12/2015 | Bower et al. |
| 2015/0373793 A1 | 12/2015 | Bower et al. |
| 2016/0005721 A1 | 1/2016 | Bower et al. |
| 2016/0018094 A1 | 1/2016 | Bower et al. |

(56) References Cited

U.S. PATENT DOCUMENTS

| | | | |
|---|---|---|---|
| 2016/0064363 A1 | 3/2016 | Bower et al. | |
| 2016/0066789 A1 | 3/2016 | Rogers et al. | |
| 2016/0086855 A1 | 3/2016 | Bower et al. | |
| 2016/0093600 A1 | 3/2016 | Bower et al. | |
| 2016/0308103 A1 | 10/2016 | Hu et al. | |
| 2017/0025593 A1 | 1/2017 | Bower et al. | |
| 2017/0047393 A1 | 2/2017 | Bower et al. | |
| 2017/0187976 A1 | 6/2017 | Cok | |
| 2017/0206845 A1 | 7/2017 | Sakariya et al. | |
| 2017/0210117 A1 | 7/2017 | Rogers et al. | |
| 2017/0213803 A1 | 7/2017 | Bower | |
| 2017/0250167 A1 | 8/2017 | Bower et al. | |
| 2017/0256521 A1 | 9/2017 | Cok et al. | |
| 2017/0287789 A1 | 10/2017 | Bower et al. | |
| 2017/0309698 A1 | 10/2017 | Bower et al. | |
| 2017/0338374 A1 | 11/2017 | Zou et al. | |
| 2018/0130751 A1 | 5/2018 | Bower | |
| 2018/0138071 A1 | 5/2018 | Bower et al. | |
| 2018/0151664 A1 | 5/2018 | Bower et al. | |
| 2018/0226287 A1 | 8/2018 | Bower et al. | |
| 2018/0277504 A1 | 9/2018 | Bower | |
| 2018/0286734 A1 | 10/2018 | Meitl et al. | |
| 2018/0323178 A1 | 11/2018 | Meitl et al. | |
| 2019/0088526 A1 | 3/2019 | Bower et al. | |
| 2019/0123032 A1* | 4/2019 | Higginson | H01L 25/167 |

FOREIGN PATENT DOCUMENTS

| | | | | |
|---|---|---|---|---|
| JP | H11-142878 A | | 5/1999 | |
| JP | 2004/039938 A | | 2/2004 | |
| JP | 2011066130 A | | 3/2011 | |
| JP | 2014090122 A | * | 5/2014 | H01L 27/12 |
| WO | WO-2006/027730 A1 | | 3/2006 | |
| WO | WO-2006/099741 A1 | | 9/2006 | |
| WO | WO-2008/103931 A2 | | 8/2008 | |
| WO | WO-2010/032603 A1 | | 3/2010 | |
| WO | WO-2010/102310 A2 | | 9/2010 | |
| WO | WO-2010/111601 A2 | | 9/2010 | |
| WO | WO-2010/132552 A1 | | 11/2010 | |
| WO | WO-2013/064800 A1 | | 5/2013 | |
| WO | WO-2013/165124 A1 | | 11/2013 | |
| WO | WO-2014/121635 A1 | | 8/2014 | |
| WO | WO-2014/149864 A1 | | 9/2014 | |
| WO | WO-2016/046283 A2 | | 3/2016 | |
| WO | WO-2017/144573 A1 | | 8/2017 | |
| WO | WO-2018/091459 A1 | | 5/2018 | |

OTHER PUBLICATIONS

Chesterfield, R. J. et al., 63.3:Multinozzle Printing: A Cost-effective Process for OLED Display Fabrication, SID 2009 Digest, vol. XL:Book II, 951-954.
Choi, H. W. et al., Efficient GaN-based Micro-LED Arrays, Mat. Res. Soc. Symp. Proc., 743:L6.28.1-L6.28.6 (2003).
Cok, R. S. et al., AMOLED displays with transfer-printed integrated circuits, Journal of the SID, 19(4):335-341, (2011).
Cok, R. S. et al., Inorganic light-emitting diode displays using micro-transfer printing, Journal of the SID, 25(10):589-609, (2017).
Elenius, Peter, Flip-Chip and Wire-Bond Interconnection Technologies, Chip Scale Review, Jul./Aug.:81-87 (2000).
Hamer et al., 63.2: AMOLED Displays Using Transfer-Printed Integrated Circuits, SID 09 Digest, 40(2):947-950 (2009).
International Search Report, PCT/EP2017/054140, 6 pages, dated May 22, 2017.
Lee, M. S. et al., Optimization of copper pillar bump design for fine pitch flip-chip packages, Microsystems, Packaging, Assembly and Circuits Technology Conference 2009, IMPACT 2009, 4th International, pp. 128-131.
Lee, S. H. etal, Laser Lift-Off of GaN Thin Film and its Application to the Flexible Light Emitting Diodes, Proc. of SPIE 8460:846011-1-846011-6 (2012).
Lu, N. et al., Bio-Integrated Electronics, IEEE International Conference on IC Design & Technology, DOI: 10.1109/ICICDT.2014.6838615, IEEE May 28, 2014, [retrieved on Jun. 17, 2014] pp. 1-5 (2014).
Ohno, Y. and Ohzeki, Y., Development of Ultrathin Bonding Wire for Fine Pitch Bonding, Nippon Steel Technical Report 59:1-5 (1993).
Poher, V. et al., Micro-LED arrays: a tool for two-dimensional neuron stimulation, J. Phys. D: Appl. Phys. 41:094014 (2008).
Roscher, H., VCSEL Arrays with Redundant Pixel Designs for 10Gbits/s 2-D Space-Parallel MMF Transmission, Annual Report, optoelectronics Department, (2005).
Trindade, A.J. et al., Precision transfer printing of ultra-thin AlInGaN micron-size light-emitting diodes, Crown, pp. 217-218, (2012).
Written Opinion, PCT/EP2017/054140, 11 pages, dated May 22, 2017.
Yaniv et al., A 640 x 480 Pixel Computer Display Using Pin Diodes with Device Redundancy, 1988 International Display Research Conference, IEEE, CH-2678-1/88:152-154 (1988).
Bower, C. A. et al., Micro-Transfer-Printing: Heterogeneous Integration of Microscale Semiconductor Devices using Elastomer Stamps, 2014 IEEE SENSORS, 3 pages and 1 page IEEE Xplore abstract, date of conference: Nov. 2-5, 2014.
Bower, C. A. et al., Transfer Printing: An Approach for Massively Parallel Assembly of Microscale Devices, IEEE, Electronic Components and Technology Conference, 2008, pp. 1105-1109.
Cok, R. S. et al., 60.3: AMOLED Displays Using Transfer-Printed Integrated Circuits, Society for Information Display, 10:902-904, (2010).
Feng, X. et al., Competing Fracture in Kinetically Controlled Transfer Printing, Langmuir, 23(25):12555-12560, (2007).
Gent, A.N., Adhesion and Strength of Viscoelastic Solids. Is There a Relationship between Adhesion and Bulk Properties?, American Chemical Society, Langmuir, 12(19):4492-4496, (1996).
Kim, Dae-Hyeong et al., Optimized Structural Designs for Stretchable Silicon Integrated Circuits, Small, 5(24):2841-2847, (2009).
Kim, Dae-Hyeong et al., Stretchable and Foldable Silicon Integrated Circuits, Science, 320:507-511, (2008).
Kim, S. et al., Microstructural elastomeric surfaces with reversible adhesion and examples of their use in deterministic assembly by transfer printing, PNAS, 107(40):17095-17100 (2010).
Kim, T. et al., Kinetically controlled, adhesiveless transfer printing using microstructured stamps, Applied Physics Letters, 94(11):113502-1-113502-3, (2009).
Meitl, M. A. et al., Transfer printing by kinetic control of adhesion to an elastomeric stamp, Nature Material, 5:33-38, (2006).
Michel, B. et al., Printing meets lithography: Soft approaches to high-resolution patterning, J. Res. & Dev. 45(5):697-708, (2001).
Final Rejection, U.S. Appl. No. 14/822,868, 24 pages, dated Nov. 27, 2018.
Non-Final Rejection, U.S. Appl. No. 14/822,868, 22 pages, dated Jun. 12, 2019.

* cited by examiner

EFFICIENTLY MICRO-TRANSFER PRINTING MICRO-SCALE DEVICES ONTO LARGE-FORMAT SUBSTRATES

PRIORITY APPLICATION

This application is a continuation of U.S. patent application Ser. No. 15/440,756, filed on Feb. 23, 2017, entitled Efficiently Micro-Transfer Printing Micro-Scale Devices onto Large Format Substrates, which claims the benefit claims priority to and benefit of U.S. Provisional Patent Application No. 62/300,040, filed Feb. 25, 2016, entitled Efficiently Micro-Transfer Printing Micro-Scale Devices onto Large-Format Substrates, the content of each of which is hereby incorporated by reference.

CROSS REFERENCE TO RELATED APPLICATION

Reference is made to U.S. patent application Ser. No. 14/822,868, entitle Compound Micro-Assembly Strategies and Devices by Bower et al., the disclosure of which is incorporated herein by reference in its entirety.

FIELD OF THE INVENTION

The present invention relates to structures and methods for micro-transfer printing micro-scale devices from source wafers to large-format substrates.

BACKGROUND OF THE INVENTION

Substrates with electronically active components such as transistors or light-emitting diodes distributed over the extent of the substrate can be used in a variety of electronic systems, for example, flat-panel imaging devices such as flat-panel liquid crystal or organic light emitting diode (OLED) display devices and in flat-panel solar cells. A variety of methods may be used to distribute electronically active circuits over substrates, including forming the electronically active circuits on a substrate and forming the components on separate substrates and placing them on a substrate. In the latter case, a variety of assembly technologies for device packaging may be used.

Electronically active components are typically formed on a substrate by sputtering a layer of inorganic semiconductor material or by spin-coating organic material over the entire substrate. Inorganic semiconductor materials can be processed to improve their electronic characteristics. For example, amorphous silicon can be treated to form low-temperature or high-temperature poly-crystalline silicon. In other process methods, microcrystalline semiconductor layers can be formed by using an underlying seeding layer. These methods typically improve the electron mobility of the semiconductor layer. The substrate and layer of semiconductor material can be photo-lithographically processed to define electronically active components, such as transistors. Such transistors are known as thin-film transistors (TFTs) since they are formed in a thin layer of semiconductor material, typically silicon. Transistors may also be formed in thin layers of organic materials. In these devices, the substrate is often made of glass, for example Corning Eagle® or Jade® glass designed for display applications.

The above techniques have some limitations. Despite processing methods used to improve the performance of thin-film transistors, such transistors may provide performance that is lower than the performance of other integrated circuits formed in mono-crystalline semiconductor material. Semiconductor material and active components can be provided only on portions of the substrate, leading to wasted material and processing costs. The choice of substrate materials can also be limited by the processing steps necessary to process the semiconductor material and the photo-lithographic steps used to pattern the active components. For example, plastic substrates have a limited chemical and heat tolerance and do not readily survive photo-lithographic processing. Furthermore, the manufacturing equipment used to process large substrates with thin-film circuitry is relatively expensive. Other substrate materials that may be used include quartz, for example, for integrated circuits using silicon-on-insulator structures as described in U.S. Patent Application 2010/0289115 and U.S. Patent Application 2010/0123134. However, such substrate materials can be more expensive or difficult to process.

Other methods used for distributing electronically functional components over a substrate in the circuit board assembly industry include, for example, pick-and-place technologies for integrated circuits provided in a variety of packages, for example, pin-grid arrays, ball-grid arrays, and flip-chips. However, these techniques may be limited in the size of the integrated circuits that can be placed.

In further manufacturing techniques, a mono-crystalline semiconductor wafer is employed as the substrate. While this approach can provide substrates with the same performance as integrated circuits, the size of such substrates may be limited, for example, to a 12-inch diameter circle, and the wafers are relatively expensive compared to other substrate materials such as glass, polymer, or quartz.

In yet another approach, thin layers of semiconductor are bonded to a substrate and then processed. Such a method is known as semiconductor-on-glass or silicon-on-glass (SOG) and is described, for example, in U.S. Pat. No. 7,605,053, issued Oct. 20, 2009. If the semiconductor material is crystalline, high-performance thin-film circuits can be obtained. However, the bonding technique and the processing equipment for the substrates to form the thin-film active components on large substrates can be relatively expensive.

Publication No. 11-142878 of the Patent Abstracts of Japan entitled *Formation of Display Transistor Array Panel* describes etching a substrate to remove it from a thin-film transistor array on which the TFT array was formed. TFT circuits formed on a first substrate can be transferred to a second substrate by adhering the first substrate and the TFTs to the surface of the second substrate and then etching away the first substrate, leaving the TFTs bonded to the second substrate. This method may require etching a significant quantity of material, and may risk damaging the exposed TFT array.

Other methods of locating material on a substrate are described in U.S. Pat. No. 7,127,810. In this approach, a first substrate carries a thin-film object to be transferred to a second substrate. An adhesive is applied to the object to be transferred or to the second substrate in the desired location of the object. The substrates are aligned and brought into contact. A laser beam irradiates the object to abrade the transferring thin film so that the transferred thin-film adheres to the second substrate. The first and second substrates are separated by peeling the film in the abraded areas from the first substrate and transferring it to the second substrate. In one embodiment, a plurality of objects is selectively transferred by employing a plurality of laser beams to abrade selected area. Objects to be transferred can include thin-film circuits.

U.S. Pat. No. 6,969,624 describes a method of transferring a device from a first substrate onto a holding substrate by selectively irradiating an interface with an energy beam. The interface is located between a device for transfer and the first substrate and includes a material that generates ablation upon irradiation, thereby releasing the device from the substrate. For example, a light-emitting device (LED) is made of a nitride semiconductor on a sapphire substrate. The energy beam is directed to the interface between the sapphire substrate and the nitride semiconductor releasing the LED and allowing the LED to adhere to a holding substrate coated with an adhesive. The adhesive is then cured. These methods, however, may require the patterned deposition of adhesive on the object(s) or on the second substrate. Moreover, the laser beam that irradiates the object may need to be shaped to match the shape of the object, and the laser abrasion can damage the object to be transferred. Furthermore, the adhesive cure takes time, which may reduce the throughput of the manufacturing system.

Another method for transferring active components from one substrate to another is described in *AMOLED Displays using Transfer-Printed Integrated Circuits* published in the Proceedings of the 2009 Society for Information Display International Symposium Jun. 2-5, 2009, in San Antonio Tex., US, vol. 40, Book 2, ISSN 0009-0966X, paper 63.2 p. 947. In this approach, small integrated circuits are formed over a buried oxide layer on the process side of a crystalline wafer. The small integrated circuits, or chiplets, are released from the wafer by etching the buried oxide layer formed beneath the circuits. A PDMS stamp is pressed against the wafer and the process side of the chiplets is adhered to the stamp. The chiplets are pressed against a destination substrate or backplane coated with an adhesive and thereby adhered to the destination substrate. The adhesive is subsequently cured. In another example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane.

In such methods it is generally necessary to electrically connect the small integrated circuits or chiplets to electrically conductive elements such as backplane contact pads on the destination substrate. By applying electrical signals to conductors on the destination substrate the small integrated circuits are energized and made operational. The electrical connections between the small integrated circuits and the backplane contact pads are typically made by photolithographic processes in which a metal is evaporated or sputtered onto the small integrated circuits and the destination substrate to form a metal layer, the metal layer is coated with a photoresist that is exposed to a circuit connection pattern, and the metal layer and photoresist are developed by etching and washing to form the patterned electrical connections between the small integrated circuits and the connection pads on the destination substrate. Additional layers, such as interlayer dielectric insulators can also be required. This process is expensive and requires a number of manufacturing steps. Moreover, the topographical structure of the small integrated circuits over the destination substrate renders the electrical connections problematic. For example, it can be difficult to form a continuous conductor from the destination substrate to the small integrated circuit because of the differences in height over the surface between the small integrated circuits and the destination substrate. Moreover, many transfer printing steps can be necessary to transfer the densely packed chiplets on the source wafer to the more sparsely packed chiplets on the destination substrate.

There is a need, therefore, for structures and methods that enable the disposition and electrical interconnection of small integrated circuits, such as micro transfer printed chiplets or light-emitting diodes, on large-format destination substrates.

SUMMARY OF THE INVENTION

In accordance with methods of the present invention, a source wafer having a plurality of micro-transfer printable source devices arranged in or on the source wafer at a source spatial density is provided. An intermediate wafer having a plurality of micro-transfer printable intermediate supports arranged in or on the intermediate wafer at an intermediate spatial density less than or equal to the source spatial density is also provided, as is a destination substrate that can have patterned electrical conductors. The source devices are micro-transfer printed from the source wafer to the intermediate supports of the intermediate wafer with a source stamp having a plurality of stamp posts at a source transfer density to make an intermediate device on each intermediate support. The intermediate devices are micro-transfer printed from the intermediate wafer to the destination substrate at a destination spatial density less than the source spatial density with an intermediate stamp having a plurality of stamp posts at an intermediate transfer density less than the source transfer density. Source devices can be light-emitting diodes (LEDs) such as inorganic light-emitting diodes made in crystalline inorganic semiconductor materials.

Because the source wafers are typically more expensive and smaller than the destination substrate and the spatial density of the source devices on the source wafer is much greater than the spatial density of the transferred source devices on the destination wafer, micro-transfer printing stamps transfer sparse arrays of source devices from the source wafer to the destination substrate. Because the arrays of source devices on the stamp are relatively sparse, a relatively large number of transfer steps with relatively fewer source devices is required. Since many transfer steps with fewer source devices takes a longer time than fewer transfer steps with more source devices, this process can take a longer time than is desirable.

Thus, according to methods of the present invention, an intermediate wafer having a patterned array of micro-transfer printable intermediate supports is provided and populated with source devices from the source wafer using a spatially dense source stamp. The intermediate wafer is larger than the source wafer. The size of source wafers is limited because the source devices are processed using photolithographic tools designed for semiconductor wafers and the tools have a limited size handling capability, for example handling 4-, 6-, 8-, or 12-inch wafers. In contrast, the intermediate wafer does not have to be a semiconductor substrate and can therefore be larger and have an alternative shape, such as a rectangular shape.

Once the larger intermediate wafer is populated at high density using the spatially dense source stamp, the source devices are micro-transfer printed from the intermediate wafer to the destination substrate using a larger spatially sparse intermediate stamp. The destination substrate is larger than the intermediate substrate which is larger than the source wafer. Thus, the larger intermediate stamp can transfer more source devices from the intermediate substrate to the destination substrate with fewer stamping operations than the smaller source stamp.

In a further embodiment, a plurality of source wafers with different source devices are provided and a plurality of the different source devices are micro-transfer printed onto the intermediate wafer. For example, the source wafers can supply red, green, and blue LEDs so that each intermediate device includes one each of the red, green, and blue LEDs and forms a full-color pixel in a display. In another embodiment, a small integrated circuit (chiplet) controller is also micro-transfer printed onto the intermediate support to control other source devices, for example, an active-matrix controller can control a full-color pixel having red, green, and blue LEDs.

In another embodiment, the plurality of devices in an intermediate device are electrically connected with electrical connections on the intermediate support. Because the intermediate wafer is smaller than the destination substrate, it is easier to provide higher resolution electrical connections at lower cost on the intermediate wafer than on the destination substrate. Electrical connections can also be provided on the destination substrate at a lower resolution than on the intermediate wafer.

In alternative embodiments of the present invention, the source devices or the intermediate devices, or both, include connection posts or spikes electrically connected to elements of the source or intermediate devices. The connection posts can contact electrical connections or electrical contact pads when the devices are micro-transfer printed. This method avoids forming electrical connections using photolithography after micro-transfer printing.

A system for making a multi-component device includes a source wafer having a plurality of micro-transfer printable source devices arranged in or on the source wafer at a source spatial density; an intermediate wafer having a plurality of micro-transfer printable intermediate supports arranged in or on the intermediate wafer at an intermediate spatial density less than or equal to the source spatial density; a destination substrate; a source stamp having a source transfer density; and an intermediate stamp having an intermediate transfer density less than the source transfer density. A micro-transfer printer for micro-transfer printing the source devices from the source wafer to the intermediate wafer at an intermediate spatial density less than or equal to the source spatial density with a source stamp at a source transfer density to make an intermediate device on each intermediate support and a micro-transfer printer for micro-transfer printing the intermediate devices from the intermediate wafer to the destination substrate at a destination spatial density less than the source spatial density with an intermediate stamp at an intermediate transfer density less than the source transfer density are included.

Embodiments of the present invention enable the micro-transfer printing of spatially dense source devices from a relatively small source wafer to a spatially sparse arrangement of source devices, or intermediate devices including source devices, on a relatively large destination substrate with fewer printing steps, thereby reducing manufacturing time and cost.

In one aspect, the disclosed technology includes a method of making a micro-transfer printed system, including: providing a source wafer having a plurality of micro-transfer printable source devices arranged in or on the source wafer at a source spatial density; providing an intermediate wafer having a plurality of micro-transfer printable intermediate supports arranged in or on the intermediate wafer at an intermediate spatial density less than or equal to the source spatial density; providing a destination substrate; micro-transfer printing the source devices from the source wafer to the intermediate supports of the intermediate wafer with a source stamp having a plurality of stamp posts at a source transfer density to make an intermediate device on each intermediate support; and micro-transfer printing the intermediate devices from the intermediate wafer to the destination substrate at a destination spatial density less than the source spatial density with an intermediate stamp having a plurality of stamp posts at an intermediate transfer density less than the source transfer density.

In certain embodiments, the method includes providing a plurality of source wafers, each source wafer having a plurality of micro-transfer printable source devices arranged on or in the respective source wafers at a respective source spatial density, and micro-transfer printing the source devices from the plurality of source wafers to the intermediate supports of the intermediate wafer with one or more source stamps at the source transfer density so that each intermediate device has a plurality of source devices.

In certain embodiments, the source wafer is a first source wafer, the source devices are first source devices, the source stamp is a first source stamp, and the source spatial density is a first source spatial density and comprising providing a second source wafer having a plurality of micro-transfer printable second source devices arranged on or in the second source wafers at a second source spatial density, and micro-transfer printing the second source devices from the second source wafer to the intermediate supports of the intermediate wafer with one or more second source stamps at the second source transfer density so that each intermediate device has a first source device and a second source device.

In certain embodiments, the method includes forming intermediate electrical connections between the source devices on the intermediate support at an intermediate resolution and forming destination electrical connections between the intermediate devices on the destination substrate at a destination resolution less than the intermediate resolution.

In certain embodiments, the method includes forming intermediate electrical connections at an intermediate resolution of less than or equal to 10 microns, 5 microns, two microns or one micro and forming destination electrical connections at a destination resolution of greater than or equal to 5 microns, 10 microns, 20 microns or 50 microns.

In certain embodiments, the method includes providing the intermediate stamp with a larger extent over the intermediate wafer than the source stamp over the source wafer.

In certain embodiments, the method includes providing the source wafer with a 12-inch diameter, an 8-inch diameter, a 6-inch diameter, or a 4-inch diameter and comprising providing the intermediate wafer with a diameter, diagonal, or side of 8 inches, 12 inches, 16 inches, 20 inches, 24 inches, 32 inches, 40 inches, 48 inches, or 64 inches.

In certain embodiments, the method includes providing a red source wafer having source devices that are red light-emitting diodes that can emit red light, providing a green source wafer having source devices that are green light-emitting diodes that can emit green light, providing a blue source wafer having source devices that are blue light-emitting diodes that can emit blue light, and wherein each intermediate device includes a red, a green, and a blue light-emitting diode.

In certain embodiments, the method includes providing a chiplet source wafer having integrated circuit control chiplet source devices, and wherein each intermediate device includes an integrated circuit control chiplet.

In certain embodiments, the method includes one or more of providing the intermediate wafer with a larger extent than the source wafer, providing the destination substrate with a larger extent than the intermediate wafer, and providing the intermediate support with an extent that is greater than the extent of the source device.

In certain embodiments, the method includes one or more of providing the intermediate wafer with a spatial format matched to the source stamp or the intermediate stamp, providing the destination substrate with a spatial format matched to the intermediate stamp, and providing the intermediate wafer with a spatial format matched to the destination substrate.

In certain embodiments, the method includes providing the intermediate stamp with an extent larger than that of the source stamp.

In certain embodiments, the method includes providing the source stamp with a diameter, diagonal, or edge of less than or equal to 1 cm, 2 cm, 5 cm, 10 cm, 15 cm, or 20 cm and providing the intermediate stamp with a diameter, diagonal, or edge of greater than or equal to 5 cm, 10 cm, 15 cm, 20 cm, 40 cm, 50 cm, 75 cm, or 100 cm.

In certain embodiments, the method includes micro-transfer printing more source devices from the source wafer to the intermediate wafer with the source stamp in a single stamp operation than are transferred by micro-transfer printing intermediate devices from the intermediate wafer to the destination substrate with the intermediate stamp in a single stamp operation.

In certain embodiments, the method includes providing the source wafer with micro-transfer printable source devices having connection posts or providing the intermediate wafer with micro-transfer printable intermediate supports having connection posts.

In certain embodiments, the method includes providing destination electrical connections on the destination substrate and electrically connecting the intermediate devices to the electrical connections on the destination substrate with the connection posts.

In certain embodiments, the method includes providing intermediate electrical connections on the intermediate support and electrically connecting the source devices to the electrical connections on the intermediate support with the connection posts.

In certain embodiments, the method includes providing the source devices as light-emitting diodes or providing the destination substrate as a display substrate.

In another aspect, the disclosed technology includes a system for making a micro-transfer printed device, including: a source wafer having a plurality of micro-transfer printable source devices arranged in or on the source wafer at a source spatial density; an intermediate wafer having a plurality of micro-transfer printable intermediate supports arranged in or on the intermediate wafer at an intermediate spatial density less than or equal to the source spatial density; a destination substrate; a source stamp having a source transfer density; an intermediate stamp having an intermediate transfer density less than the source transfer density; a micro-transfer printer for micro-transfer printing the source devices from the source wafer to the intermediate supports of the intermediate wafer with a source stamp at a source transfer density to make an intermediate device on each intermediate support; and a micro-transfer printer for micro-transfer printing the intermediate devices from the intermediate wafer to the destination substrate at a destination spatial density less than the source spatial density with an intermediate stamp at an intermediate transfer density less than the source transfer density.

In certain embodiments, the source devices are light-emitting diodes or the destination substrate is a display substrate.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 1:
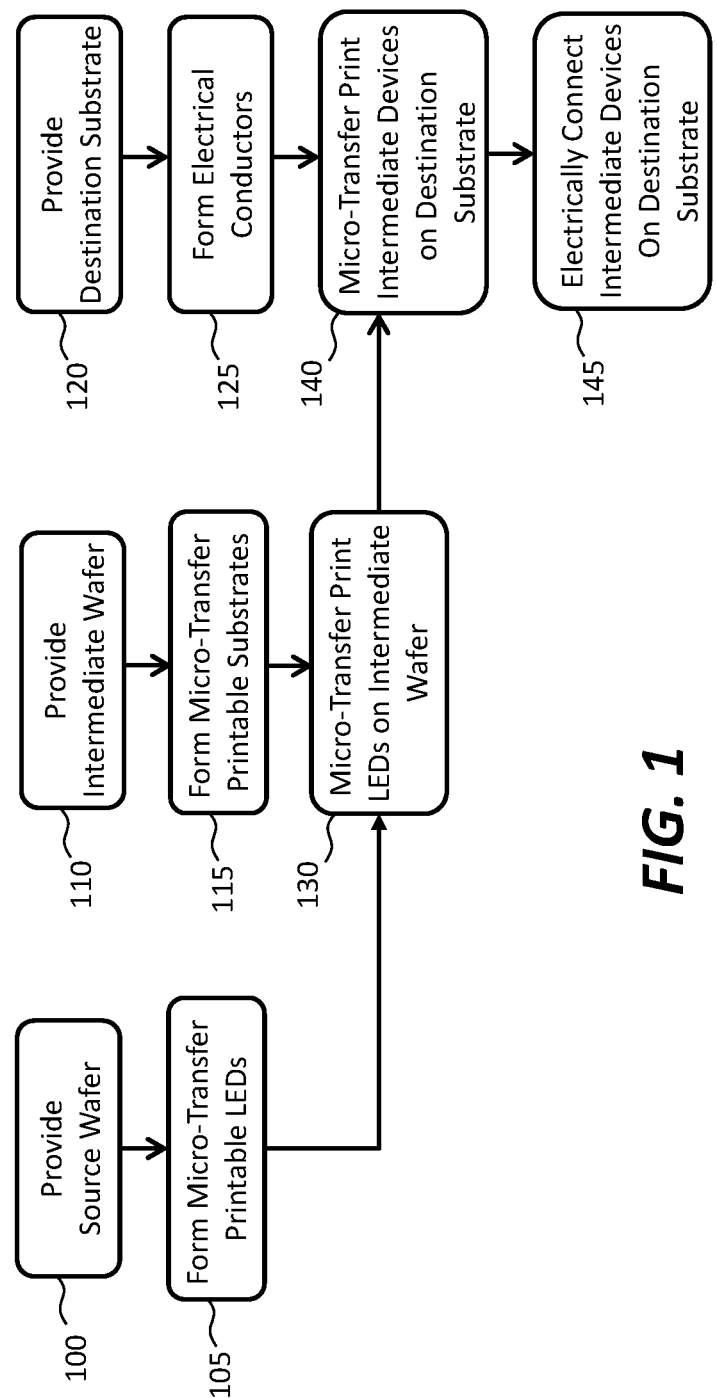
FIG. 1 is a flow chart illustrating a method of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

The present invention provides structures and methods for efficiently micro-transfer printing source devices from a source wafer to a destination substrate. Referring to the flow chart of FIG. 1 and the schematic illustration of FIG. 2, in an embodiment of the present invention a method of making a micro-transfer printed system or device includes providing a source wafer 10 in step 100. The source wafer 10 can be, for example, a semiconductor wafer or a compound semiconductor wafer. The source wafer 10 is provided in step 105 with a plurality of micro-transfer printable source devices 12 arranged in or on the source wafer 10 at a source spatial density. The source spatial density is the number of source devices 12 per unit area of the source wafer 10. The source devices 12 can be formed using integrated circuit photolithographic processes and, in certain embodiment, the source devices 12 are or include electronic elements such as light-emitting diodes (LEDs). In certain embodiments the source devices 12 are or include electronic elements such as small integrated circuits such as chiplets including digital or analog logic circuits.

In step 110, an intermediate wafer 20 is provided. The intermediate wafer 20 can be glass, polymer, metal, ceramic, or a semiconductor wafer such as a silicon wafer. In step 115, a plurality of micro-transfer printable intermediate supports 24 are formed in the intermediate wafer 20 at an intermediate spatial density that is less than or equal to the source spatial density. The intermediate spatial density is the number of intermediate substrates 24 per unit area of the intermediate wafer 20. The intermediate wafer 20 can be or include glass, polymer, quartz, metal, or semiconductor and can be any substrate on which the source devices 12 can be micro-transfer printed or interconnected on the micro-transfer printable intermediate supports 24. A destination substrate 30 is provided in step 120 and can have electrical conductors (e.g., row conductors 32 and column conductors 34 arranged in orthogonal arrays) formed in step 125. The destination substrate 30 can be, but is not necessarily, a display substrate 30 used in a flat-panel display (e.g., including glass, polymer, ceramic, or metal) and the row and column conductors 32, 34 can be metal wires or electrical conductors formed using photolithographic methods and tools.

Referring next to step 130, the source devices 12 are micro-transfer printed from the source wafer 10 to the intermediate supports 24 of the intermediate wafer 20 with a source stamp to make an intermediate device 22 on each intermediate support 24. The source stamp has a plurality of source stamp posts at a source transfer density defined as the number of effective source stamp posts per unit area of the source stamp. An effective source stamp post is a source stamp post that picks up a source device 12. The source transfer density can be less than or the same as the source spatial density. In certain embodiments, electrical conductors 28 (FIG. 5) are formed to electrically connect the source devices 12 (not shown in FIG. 1) on a respective intermediate support 24. In step 140, the intermediate devices 22 on the intermediate supports 24 of the intermediate wafer 20 are micro-transfer printed to the destination substrate 30 at a destination spatial density that is less than the source spatial density with an intermediate stamp. The intermediate stamp can have a plurality of intermediate stamp posts at an intermediate transfer density less than the source transfer density, the intermediate transfer density defined as the number of effective intermediate stamp posts per unit area of the intermediate stamp. An effective intermediate stamp post is an intermediate stamp post that picks up an intermediate device 22. The intermediate devices 22 can be electrically connected on the destination substrate 30 with electrical conductors (e.g., row conductors 32 and column conductors 34) using photolithographic methods and materials in step 145.

Figure 2:
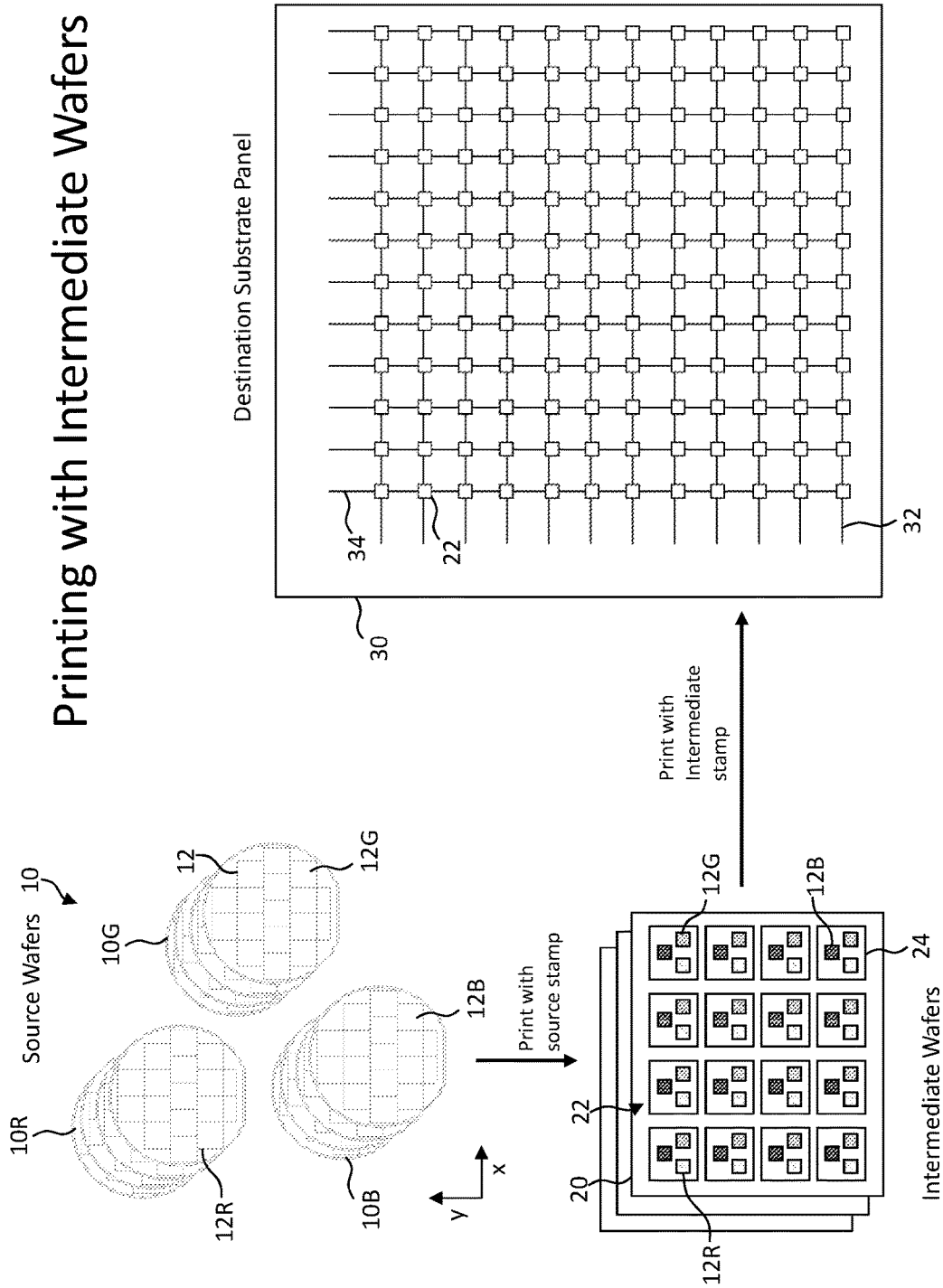
FIG. 2 is a schematic illustration of a source wafer, an intermediate wafer, a destination substrate, and a method of constructing a destination substrate with a sparse array of source devices according to an embodiment of the present invention.

As also shown in FIG. 2, in a further embodiment of the present invention a plurality of source wafers 10 are provided. Each source wafer 10 has a plurality of micro-transfer printable source devices 12 arranged in or on the respective source wafers 10 at a respective source spatial density. The source devices 12 from the plurality of source wafers 10 are micro-transfer printed to the intermediate wafer 20 with one or more source stamps at the respective source transfer density so that each intermediate device 22 has a plurality of source devices 12. For example, first and second source wafers 10 can be provided having respective first and second source devices 12 at respective first and second source spatial densities that are micro-transfer printed to the intermediate wafer 20 using respective first and second source stamps at respective first and second source transfer densities so that each intermediate device 22 has a first source device 12 and a second source device 12. The first and second source spatial densities can be the same, or different and the first and second source transfer densities can also be the same, or different. Additional source wafers and source stamps may be used. A source stamp may be used to pick up and print devices from multiple source wafers (i.e., in different print operations) such that a single stamp can be used to print multiple devices to the same intermediate support.

As shown in FIG. 2, the plurality of source wafers 10 can include a red source wafer 10R having source devices 12R that are red light-emitting diodes that can emit red light, a green source wafer 10G having source devices 12G that are green light-emitting diodes that can emit green light, and a blue source wafer 10B having source devices 12B that are blue light-emitting diodes that can emit blue light. Thus, each intermediate device 22 includes a red, a green, and a blue light-emitting diode on each respective intermediate support 24 and can be a full-color pixel in a display. In a further embodiment of the present invention, a chiplet source wafer 10 having integrated circuit control chiplet source devices 12 is provided so that each intermediate device 22 includes an integrated circuit control chiplet on the intermediate support 24. The integrated circuit control chiplet source device 12 can control other source devices 12 in the intermediate device 22. For example, the integrated circuit control chiplet source device 12 can provide active-matrix control to LEDs in a full-color pixel intermediate device 22. Active-matrix control circuits can be formed in small integrated circuits using photolithographic integrated circuit methods, tools, and materials.

Figure 4:
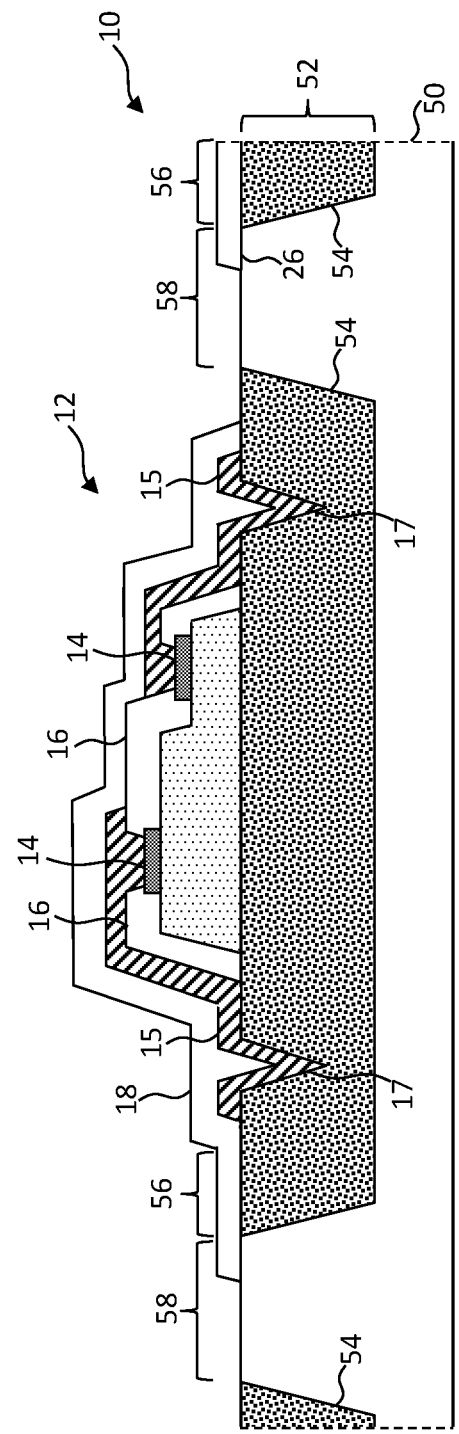
FIG. 4 is a cross section of a source wafer and source device according to an embodiment of the present invention having micro-transfer printable LED components with connection posts.

Referring to FIG. 4, a source wafer 10 includes a source wafer substrate 50 having a patterned sacrificial layer 52 forming a plurality of sacrificial portions 54 spatially and laterally separated by anchors 58. The anchors 58 can be portions of the source wafer substrate 50. The source wafer substrate 50 can be a semiconductor or compound semiconductor. A source device 12, for example, including an LED made of a compound semiconductor such as GaN, is disposed or formed on or over each sacrificial portion 54. In the example of FIG. 4, the LED includes source device electrical contacts 14 and patterned dielectric materials 16 to electrically insulate portions of the LED. The source device electrical contacts 14 are electrically connected to electrodes 15. In certain embodiments, as shown here, and the entire source device 12 is encapsulated with an encapsulation layer 18 for environmental protection and to provide mechanical robustness.

In an embodiment, the electrodes 15 are electrically connected on the intermediate support 24 or the destination substrate 30 using photolithography. In an alternative embodiment, and as shown in FIG. 4, the electrodes 15 form source connection posts 17 or spikes. When the source device 12 is micro-transfer printed, the source connection posts 17 can contact intermediate electrical conductors 28 (FIG. 5) to form an electrical connection. Demonstrations have shown that the source connection posts 17 can deform or pierce the intermediate electrical conductors 28 to form the electrical connection. Connection posts 17 are discussed in more detail, in U.S. Pat. No. 8,889,485, entitled Methods for Surface Attachment of Flipped Active Components by Christopher Bower, and in U.S. patent application Ser. No. 14/822,864, filed Aug. 10, 2015, entitled Chiplets with Connection Posts by Prevatte et al., the disclosures of which are incorporated herein by reference in their entirety. Additionally, systems and methods for driving display systems are described in U.S. patent application Ser. No. 15/003,721, filed Jan. 21, 2016, entitled Serial Row-Select Matrix-Addressed System, by Cok which is incorporated herein by reference in its entirety. Printable LEDs are described in U.S. patent application Ser. No. 15/373,865, filed Dec. 9, 2016, entitled Micro-Transfer Printable LED Component, which is incorporated herein by reference in its entirety.

The sacrificial layer 52 can be an oxide layer or a selected portion of the source wafer substrate 50 that can be anisotropically etched. The patterned dielectric material 16 can be silicon nitride or silicon dioxide, as can the encapsulation layer 18. The electrodes 15 can be a metal, for example aluminum, gold, silver, tungsten, tantalum, titanium or other metals or metal alloys. These elements can be deposited (e.g., by evaporation or coating) and patterned (e.g., with photo-sensitive material and exposure masks) using photolithographic methods, materials, and tools.

The structure of FIG. 4 can be made by providing the source wafer substrate 50, depositing and then patterning the sacrificial layer 52 to form the sacrificial portions 54 and anchors 58. Forms for the spikes are pattern-wise etched into the sacrificial portions 54. In one embodiment, a desired element (such as an LED or integrated circuit chiplet) is disposed on the sacrificial portions 54 by micro-transfer printing from a device substrate. In another embodiment, the desired element is formed on the sacrificial portions 54 using photolithographic techniques. In one method, a patterned epitaxial growth layer is provided upon the sacrificial layer 52 and structures are formed on the epitaxial growth layer. The electrodes 15 are then deposited and patterned, as is the encapsulation layer 18.

In a method of the present invention, the patterned sacrificial layer 52 is a patterned layer of material different from the source wafer substrate 50 material that can be etched to form a gap between the source device 12 and the source wafer substrate 50. In another method of the present invention, the patterned sacrificial layer 52 is a defined portion of the source wafer substrate 50 that can be anisotropically etched to form a gap between the source device 12 and the source wafer substrate 50. In an embodiment, the sacrificial portions 54 are gaps. In any case, the gap results in a tether 56 that physically connects the source device 12 to the anchor 58 so that a stamp post of a micro-transfer stamp can contact the source device 12, fracture the tether 56 to release the source device 12 from the source wafer 10, and adhere the source device 12 to the stamp post and thereby enable the source device 12 to be micro-transferred to the intermediate support 24.

Figure 5:
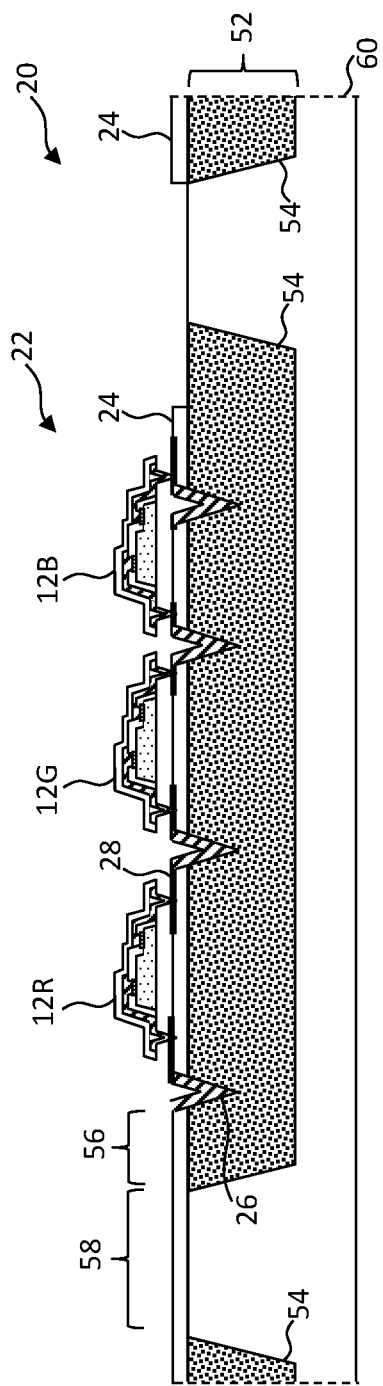
FIG. 5 is a cross section of an intermediate wafer and intermediate device according to an embodiment of the present invention having micro-transfer printable full-color pixel components with connection posts.

Referring to FIG. 5, an intermediate wafer 20 includes an intermediate wafer substrate 60 having a patterned sacrificial layer 52 forming a plurality of sacrificial portions 54 spatially separated by anchors 58. The anchors 58 can be portions of the intermediate wafer substrate 60. An intermediate support 24 is disposed on each sacrificial portion 54 and one or more source devices 12, such as red, green, and blue source devices 12R, 12G, 12B, are disposed on or over each intermediate support 24. Intermediate electrical conductors 28 (such as wires) can be formed on the intermediate support 24 and electrically connect the source devices 12 and the connection posts 26 (if present). For clarity, the red, green, and blue source devices 12R, 12G, 12B are illustrated in a linear arrangement rather than the triangular arrangement of FIG. 2. However, the source devices 12 can be disposed on the intermediate support 24 in any desired arrangement.

In an embodiment, the electrodes 15 of the source devices 12 are electrically connected to the intermediate electrical conductors 28 using photolithography or the intermediate electrical conductors 28 are formed using photolithography. In an alternative embodiment, and as shown in FIG. 5, the electrodes 15 form source connection posts 17 (FIG. 4) that impinge upon or pierce the intermediate electrical conductors 28 to form an electrical connection. In a further embodiment, the intermediate electrical conductors 28 form intermediate connection posts 26 or spikes. When the intermediate device 22 is micro-transfer printed, the intermediate connection posts 26 can contact electrical conductors (e.g., row and column conductors 32, 34) on a destination substrate 30 to form an electrical connection.

The sacrificial layer 52 can be an oxide layer or a selected portion of the intermediate wafer substrate 60 that can be anisotropically etched, the intermediate support 24 can be silicon nitride, silicon dioxide, a resin, a cured resin, or a polymer. In various embodiments, the patterned intermediate supports 24 can be glass, resin, an oxide, or a nitride and can be deposited by coating, evaporation, or sputtering. In an embodiment, the intermediate device 22 is encapsulated (not shown), for example with a resin. The intermediate electrical conductors 28, row conductors 32, or column conductors 34 can be a metal, for example aluminum, gold, silver, tungsten, tantalum, titanium or other metals or metal alloys. These elements can be deposited (e.g., by evaporation or coating) and patterned (e.g., with photo-sensitive material and exposure masks) using photolithographic methods, materials, and tools.

The structure of FIG. 5 can be made by providing the intermediate wafer substrate 60, depositing and then patterning the sacrificial layer 52 to form the sacrificial portions 54 and anchors 58. An intermediate support 24 is provided, for example by evaporation or coating and patterned using photolithographic methods. Forms for the spikes are etched into the intermediate support 24 or sacrificial portions 54. The source devices 12 are disposed on the intermediate support 24 by micro-transfer printing from the source wafer 10. If source connection posts 17 are not used, the intermediate electrical conductors 28 are then deposited and patterned, as is the encapsulation layer, if present.

In a method of the present invention, the patterned sacrificial layer 52 is a patterned layer of material different from the source wafer substrate 50 material that can be etched to form a gap between the intermediate support 24 and the intermediate wafer substrate 60. In another method of the present invention, the patterned sacrificial layer 52 is a defined portion of the intermediate wafer substrate 60 that can be anisotropically etched to form a gap between the intermediate device 22 and the intermediate wafer substrate 60. In an embodiment, the sacrificial portions 54 are gaps. In any case, the gap results in a tether 56 that physically connects the intermediate device 22 to the anchor 58 so that a stamp post of a micro-transfer stamp can contact the intermediate device 22, fracture the tether 56 to release the intermediate device 22 from the intermediate wafer 60 and adhere the intermediate device 22 to the stamp post and thereby enable the intermediate device 22 to be micro-transfer printed to the destination substrate 30. In various embodiments of the present invention, the patterned sacrificial layer 52 or the sacrificial portions 54 are a pattern of etchable material distinct from the source wafer substrate 50 material, are a pattern of defined portions of the source wafer substrate 50 material that are anisotropically etchable, or are a pattern of gaps forming a space between the source devices 12 and the source wafer substrate 50.

In another embodiment of the present invention, the source devices 12 micro-transfer printed onto the intermediate support 24 are electrically connected with intermediate electrical conductors 28 between the source devices 12 on the intermediate support 24 at an intermediate resolution. Destination substrate electrical conductors (e.g., the row conductors 32 and column conductors 34) electrically connect the intermediate devices 22 on the destination substrate 30 at a destination resolution less than the intermediate resolution. The resolution of an electrical conductor or connection is the size of the smallest element in a dimension over an area that can be reliably made or the minimum spacing between components that can be reliably achieved without electrical shorts. In various embodiments, the intermediate electrical connections have an intermediate resolution of less than or equal to 10 microns, less than or equal to 5 microns, less than or equal to two microns or less than or equal to one micro and the destination electrical connections have a destination resolution of greater than or equal to 5 microns, greater than or equal to 10 microns, greater than or equal to 20 microns or greater than or equal to 50 microns.

In an embodiment of the present invention, the intermediate stamp is provided with a larger extent over the intermediate wafer 20 than the source stamp is provided with over the source wafer 10. Wafers are typically relatively thin and flat, having an area with dimensions (typically represented as the x and y dimensions as shown in FIG. 2) that are much greater than the thickness of the wafer (typically represented as the z dimension). The stamp extent is the contiguous area enclosed by a convex hull perimeter surrounding the stamp posts. In various embodiments, the source stamp is provided with a diameter, diagonal, or edge of less than or equal to 1 cm, less than or equal to 2 cm, less than or equal to 5 cm, less than or equal to 10 cm, less than or equal to 15 cm, or less than or equal to 20 cm. The intermediate stamp can be provided with a diameter, diagonal, or edge of greater than or equal to 5 cm, 10 cm, greater than or equal to 15 cm, greater than or equal to 20 cm, greater than or equal to 40 cm, greater than or equal to 50 cm, greater than or equal to 75 cm, or greater than or equal to 100 cm.

In an embodiment of the present invention, the intermediate wafer 20 is provided with a larger extent than the source wafer 10 and the destination substrate 30 is provided with a larger extent than the intermediate wafer 20. Furthermore, the intermediate support 24 can be provided with an extent that is greater than the extent of the source device 12. The extent of a wafer or substrate is the area of the wafer or substrate in the x, y dimensions or the contiguous area enclosed by a convex hull perimeter surrounding the source devices 12 on the wafer or substrate surface. The source wafers 10 can be provided with a 12-inch diameter, an 8-inch diameter, a 6-inch diameter, a 4-inch diameter, or a 2-inch diameter, or less. The intermediate wafer 20 can be provided with a diameter, diagonal, or side of 4 inches, 8 inches, 12 inches, 16 inches, 20 inches, 24 inches, 32 inches, 40 inches, 48 inches, 64 inches, or more. In general, the source wafers 10 have a circular cross section with a flat edge forming a chord. The intermediate wafer 20 can have the shape of a conventional semiconductor wafer or have a rectangular shape as can the display substrate 30.

In another embodiment, the intermediate wafer 20 is provided with a spatial format matched to the source stamp or the intermediate stamp. Alternatively or in addition, the destination substrate 30 is provided with a spatial format matched to the intermediate stamp. In yet another embodiment, the intermediate wafer 20 is provided with a spatial format matched to the destination substrate 30. The spatial format of a wafer or substrate is the shape of the wafer or substrate, for example rectangular, square, or circular. Alternatively, the spatial format of a wafer or substrate is the shape of a contiguous area enclosed by a convex hull perimeter surrounding the source devices 12 or intermediate supports 24 on the wafer or substrate surface.

In a further embodiment of the present invention, more source devices 12 are micro-transfer printed from the source wafer 10 to the intermediate wafer 20 with the source stamp in a single stamp operation than are transferred by micro-transfer printing intermediate devices 22 from the intermediate wafer 20 to the destination substrate 30 with the intermediate stamp in a single stamp operation. In general, the source stamp will have a denser arrangement of stamp posts and a smaller extent than the intermediate stamp and the intermediate stamp will have a sparser arrangement of stamp posts and a greater extent than the source stamp.

In an embodiment of the present invention and as illustrated in FIG. 4, the source wafer 10 is provided with micro-transfer printable source devices 12 having source connection posts 17. The source connection posts 17 can electrically connect the electrodes 15 (FIG. 1) to the intermediate electrical connections 28 on the intermediate support 24 to electrically connect the source devices 12 to the intermediate electrical connections 28 on the intermediate support 24 and to the intermediate connection posts 26 of the intermediate support 24. Similarly, as illustrated in FIG. 5, the intermediate wafer 20 is provided with micro-transfer printable intermediate supports 24 having intermediate connection posts 26. The intermediate connection posts 26 can electrically connect the intermediate electrical connections 28 (and electrodes 15 of FIG. 4) to the destination electrical connections (e.g., row conductors 32 and column conductors 34) on the destination substrate 30 to electrically connect the source devices 12 to the row and column conductors 32, 34 of the destination substrate 30.

In operation, a controller (not shown) provides electrical signals, power, and a ground reference to the row conductors 32 and column conductors 34 on the destination substrate 30. The electrical signals pass through the row conductors 32 and column conductors 34, the intermediate connection posts 26, the intermediate electrical conductors 28 of the intermediate wafer 20, the source connection posts 17, and the electrodes 15 to the source electronic element, such as an LED, to control the electronic element.

A system for making a micro-transfer printed device includes a source wafer 10 having a plurality of micro-transfer printable source devices 12 arranged in or on the source wafer 10 at a source spatial density; an intermediate wafer 20 having a plurality of micro-transfer printable intermediate supports 24 arranged in or on the intermediate wafer 20 at an intermediate spatial density less than or equal to the source spatial density; a destination substrate 30; a source stamp having a source transfer density; an intermediate stamp having an intermediate transfer density less than the source transfer density; a micro-transfer printer for micro-transfer printing the source devices 12 from the source wafer 10 to the intermediate supports 24 of the intermediate wafer 20 with a source stamp at a source transfer density to make an intermediate device 22 on each intermediate support 24; a micro-transfer printer for micro-transfer printing the intermediate devices 22 from the intermediate wafer 20 to the destination substrate 30 at a destination spatial density less than the source spatial density with an intermediate stamp at an intermediate transfer density less than the source transfer density. The source devices 12 can be light-emitting diodes. The destination substrate 30 can be a display substrate.

Figure 3:
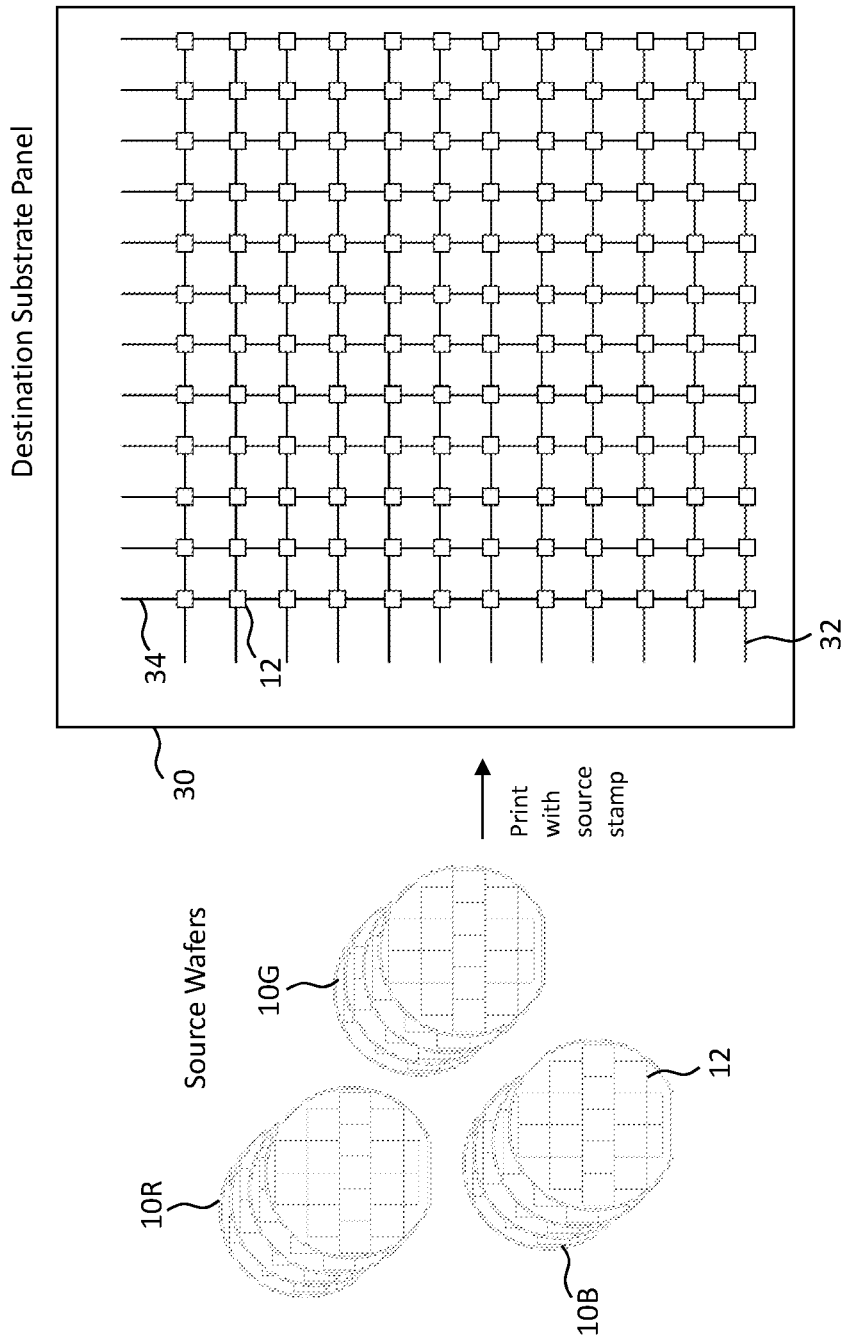
FIG. 3 is a schematic illustration of a source wafer, a destination substrate, and a method of constructing a destination substrate with a sparse array of source devices.

In a simplified theoretical illustration of the advantages of the present invention, the destination substrate 30 is a display substrate and the source devices 12 are LEDs 12. A source wafer 10 has a 100×100 array of LEDs 12, each LED 12 having an area of 15 microns×15 microns on a 100-micron pitch, so that the source wafer 10 has 10,000 LEDs 12 and an extent of 1 cm×1 cm. The destination substrate 30 requires a 1,000×1,000 array of LEDs 12 on a 1 mm pitch so that the destination substrate 30 has 1,000,000 LEDs 12 and an extent of 1 m×1 m. Thus, the spatial density of the LEDs on the source wafer 10 is 100 times the spatial density of the LEDs on the destination substrate 30. Referring to FIG. 3, the LEDs 12 on the source wafer 10 can be directly micro-transfer printed to the destination substrate 30 with a source stamp. Because of the size and density of the source wafer 10 compared to the destination substrate 30, the source stamp can transfer a 10×10 array of LEDs 12 on a 1 mm pitch in each of the x and y dimensions. Therefore, 100 LEDs 12 are transferred in each stamp operation so that to completely populate the destination substrate 30 requires 10,000 stamp operations.

In contrast, and according to an embodiment of the present invention, referring again to FIG. 2, the LEDs 12 are micro-transfer printed from the source wafer 10 to the intermediate wafer 20. This transfer can be done multiple times at the same spatial density so that all 10,000 of the LEDs (i.e., LEDs 12) on a source wafer 10 are transferred in one source stamp operation and the entire 1,000×1,000 array of LEDs (i.e., LEDs 12) can be disposed on the intermediate substrate in 100 stamp operations from 100 different source wafers (i.e., source wafers 10). The intermediate wafer (i.e., intermediate wafer 20) must have an array of intermediate substrates (i.e., intermediate substrates 24) at the same 100-micron pitch in each of the x and y dimensions and a size of 10 cm in each dimension (1,000× 100 microns). The intermediate substrates (i.e., intermediate substrates 24) can have any size up to 100 microns on a side, for example 75 microns×75 microns. The intermediate devices (i.e., intermediate devices 22) (including an LED 12 and intermediate support 24) are then micro-transfer printed to the destination substrate (i.e., destination substrate 30). The intermediate stamp can transfer an array of 100×100 intermediate devices (i.e., intermediate devices 22) in each intermediate stamp operation since the difference in spatial density between the intermediate wafer (i.e., intermediate wafer 20) and the destination substrate (i.e., destination substrate 30) is a factor of 10 in each of the x and y dimensions. Therefore, 10,000 intermediate devices (i.e., intermediate devices 22) are transferred in each intermediate stamp operation and 100 intermediate stamp operations are needed to fully populate the destination substrate (i.e., destination substrate 30). Thus, according to this example of the present invention, 100 plus 100 equals 200 stamp operations are needed to micro-transfer print the LEDs 12 from the source wafer (i.e., source wafer 10) to the destination substrate (i.e., destination substrate 30) compared to 10,000 operations using a direct micro-transfer printing method, resulting in a reduction of 98% in stamp operations.

In a further example, the display is a full-color display and three source devices (i.e., source devices 12—a red LED 12R, a green LED 12G, and a blue LED 12B) are micro-transfer printed from the red, green, and blue source wafers (i.e., wafers 10R, 10G, and 10B). Using the direct printing method of FIG. 3, three times the number of transfers are necessary, for a total of 30,000 transfers. Using a method of the present invention as illustrated in FIG. 2, three times the number of transfers are needed to populate the intermediate supports (i.e., intermediate supports 24) of the intermediate wafer (i.e., intermediate wafer 20), totaling 300 micro transfer print operations. Each intermediate support (i.e., intermediate support 24) can have a size of 75 microns×75 microns and will then have one each of a red LED 12R, a green LED 12G, and a blue LED 12B to make up the intermediate device (i.e., intermediate device 22). The intermediate devices (i.e., intermediate devices 22) are then micro-transfer printed to the destination substrate (i.e., destination substrate 30) in 100 print operations as before for a total of 400 micro-transfer print operations. This compares with the 30,000 print operations required in the illustration of FIG. 3 and is a reduction of 98.7% in stamp operations.

Figure 6:
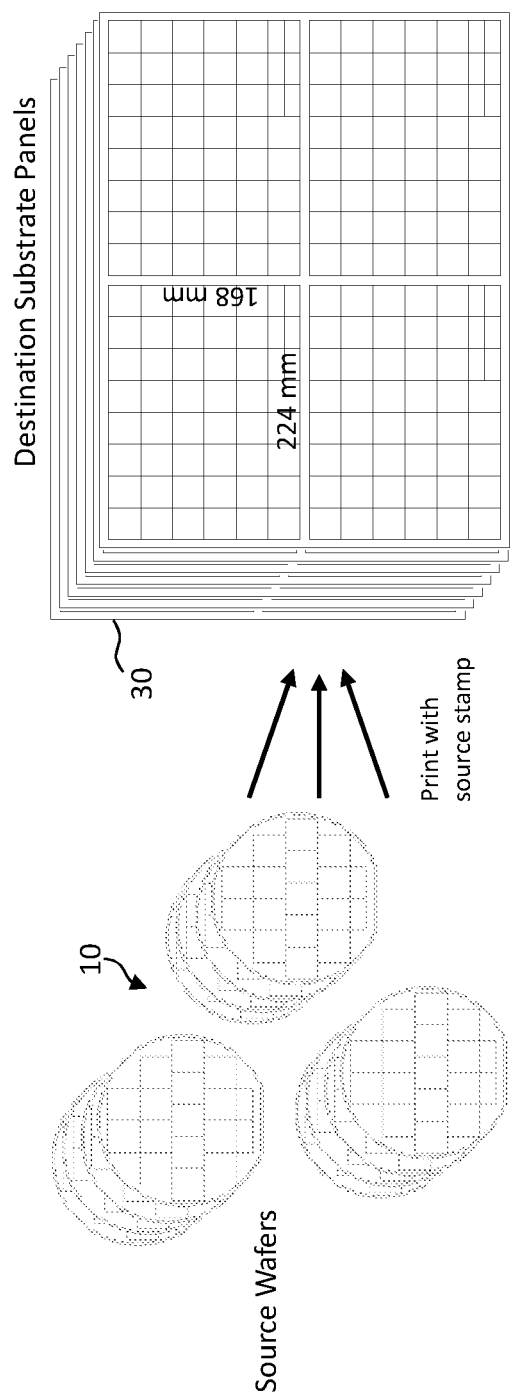
FIG. 6 is a schematic illustration corresponding to FIG. 3 including exemplary descriptive material.
Figure 7:
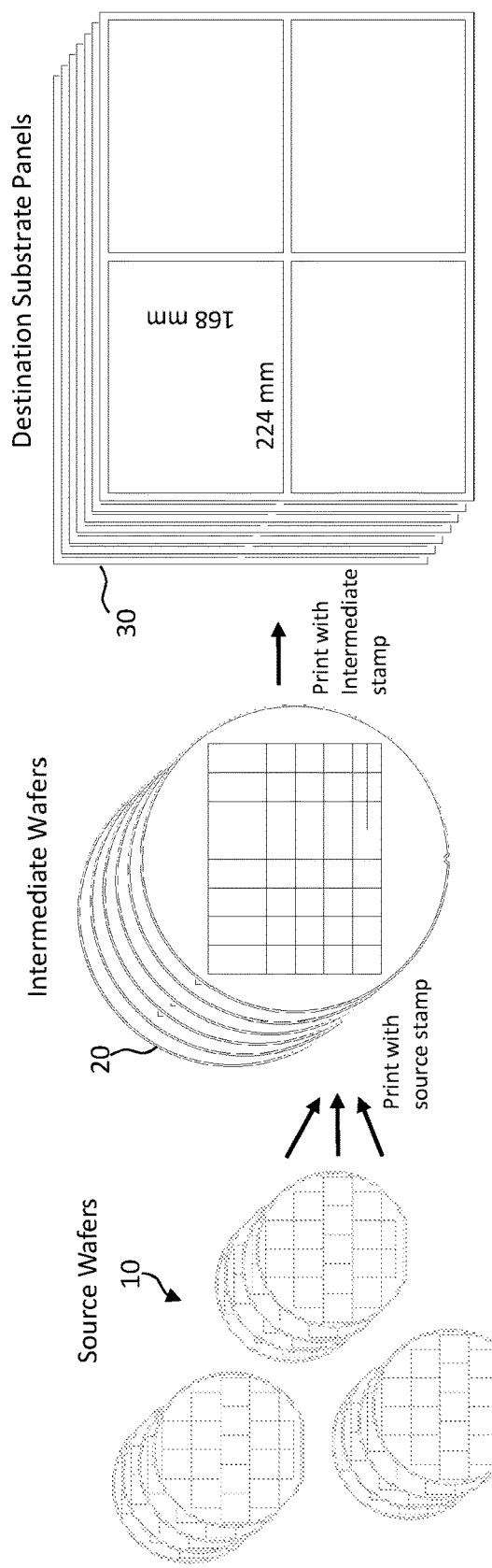
FIG. 7 is a schematic illustration corresponding to FIG. 2 with additional exemplary information.

In one example, red, green, and blue LEDs (i.e., 12R, 12G, 12B) are provided on source wafers (i.e., 10R, 10G, 10B), each source wafer (i.e., source wafer 10) having 2540 LEDs (i.e., LEDs 12) per inch and 125,440,000 LEDs in total on the source wafer (shown in FIGS. 6 and 7). One each of the red, green, and blue LED source wafers 10 can supply 408 displays 30 with 72.5 pixels per inch for a VGA-resolution 640×480 (e.g., 480i) display of 224 mm by 168 mm and 307,200 pixels per display. Using the direct print method of FIG. 3 (e.g., with a stamp having a stamp size of 28 mm), 153 print steps are required to populate the display, as shown in FIG. 6. Therefore, 1 million displays would require 153,000,000 total prints. As illustrated in FIG. 7, using the method of FIG. 2 and according to an embodiment of the present invention, an intermediate wafer (i.e., intermediate wafer 20) has 508 LEDs (i.e., LEDs 12) per inch and 15,052,800 intermediate supports (i.e., intermediate supports 24), each forming a full-color pixel intermediate device (i.e., intermediate device 22) with a red, green, and blue LED (e.g., 12R, 12G, 12B) formed by printing the LEDs from red, green, and blue source wafers 10 using 153 print steps. Each intermediate wafer (i.e., intermediate wafer 20) can supply enough intermediate devices (i.e., intermediate devices 22) for 49 displays. Each display of 307,200 pixels can be micro-transfer printed in a single step, representing (on average) 4.12 transfer printing operations per display (approx. 4,122,500 prints per million displays), a reduction of 97% in microtransfer print operations compared to the direct print approach for the VGA-resolution 640×480 (e.g., 480i) display of 224 mm by 168 mm.

In another example, red, green, and blue LED 12R, 12G, 12B are provided on 150 mm source wafers 10R, 10G, 10B each having 2540×1270 LEDs per inch and 62,720,000 LEDs (i.e., LEDs 12) per source wafer 10 sufficient to supply 204 VGA (640×480) displays. Using a stamp size of 28 mm×28 mm, it would again require 153 direct micro-transfer print operations using the direct micro-transfer printing method of FIG. 3. A 300 mm intermediate wafer can be completely populated in 153 steps and can supply 49 displays, each display micro-transfer printed in a single micro-transfer print operation, representing (on average) 4.12 transfer printing operations per display, a reduction of 97% in micro-transfer print operations compared to the direct print approach. In this example, the intermediate resolution can be 2-micron lines and spaces and the destination resolution can be 15-micron lines and spaces.

In another example using a single rectangle layout for the red, green, and blue LEDs 12R, 12G, 12B on the respective source wafers 10R, 10G, 10B, each source wafer (i.e., source wafer 10) has 47,040,000 LEDs (i.e., LEDs 12), enough to supply 153 displays. Using a larger stamp size of 112×84 mm², the number of micro-transfer print steps for the direct approach is reduced to 12. The equivalent number of steps using a method of the present invention is 1.245 prints per display, for an improvement of 90%. In general, if the wafers and stamps are larger and more expensive, the relative advantage of the method of the present invention is decreased, for example to 90%, and if the wafers and stamps are smaller, the relative advantage is increased, for example to 98%. Cost modeling demonstrates that methods of the present invention provide manufacturing cost savings.

The source devices 12 can be active components, for example including one or more active elements such as electronic transistors or diodes or light-emitting diodes and photodiodes that produce an electrical current in response to ambient light as well as passive components such as resistors, capacitors, or conductors. The source devices 12 can be semiconductor devices having one or more semiconductor layers, such as an integrated circuit. The source devices 12 can be unpackaged die. In yet another embodiment, the intermediate devices 22 are compound elements having a plurality of active or passive elements, such as multiple semiconductor devices with separate substrates, each with one or more active elements or passive elements, or both.

The source devices 12 made by methods of the present invention can include or be a variety of chiplets having semiconductor structures, including a diode, a light-emitting diode (LED), a transistor, or a laser. The source devices 12 can include inorganic materials such as silicon or gallium arsenide, or inorganic materials having various structures, including crystalline, microcrystalline, polycrystalline, or amorphous structures. The source devices 12 or intermediate devices 22 can also include insulating layers and structures such as silicon dioxide, nitride, and passivation layers and conductive layers or structures such as wires made of aluminum, titanium, silver, or gold that form an electronic circuit.

Chiplets are small integrated circuits and can be unpackaged dies released from a source wafer 10 and can be micro transfer printed. Chiplets can have at least one of a width, length, and height from 2 to 5 µm, 5 to 10 µm, 10 to 20 µm, or 20 to 50 µm. Chiplets can have a doped or undoped semiconductor substrate thickness of 2 to 5 µm, 5 to 10 µm, 10 to 20 µm, or 20 to 50 µm. The chiplet or source devices 12 can be micro-light-emitting diodes with a length greater than width, for example having an aspect ratio greater than or equal to 2, 4, 8, 10, 20, or 50 and electrical contact pads 14 that are adjacent to the ends of the printable semiconductor source devices 12 along the length of the printable semiconductor source devices 12. This structure enables low-precision manufacturing processes to electrically connect wires to the source device electrical contact pads 14 without creating registration problems and possible unwanted electrical shorts or opens.

The chiplet source devices 12 can be made in a source semiconductor wafer (e.g., a silicon or GaN wafer) having a process side and a back side used to handle and transport the wafer. Source devices 12 are formed using lithographic processes in an active layer on or in the process side of the source wafer 10. An empty release layer space (e.g., the etched sacrificial layer 52) is formed beneath the source devices 12 with tethers 56 connecting the source devices 12 to the source wafer 10 in such a way that mechanical pressure applied against the source devices 12 breaks the tethers 56 to release the source devices 12 from the source wafer 10. Methods of forming such structures are described, for example, in the paper *AMOLED Displays using Transfer-Printed Integrated Circuits* and U.S. Pat. No. 8,889,485. Lithographic processes for forming source devices 12 in a source wafer 10, for example transistors, wires, and capacitors, can be found in the integrated circuit art. U.S. patent application Ser. No. 14/743,981, filed Jun. 18, 2015, entitled Micro Assembled LED Displays and Lighting Elements, by Bower et al. incorporated herein by reference describes micro-transfer printing structures and processes useful with the present invention. For a discussion of micro-transfer printing techniques see also U.S. Pat. Nos. 8,722,458, 7,622, 367 and 8,506,867, each of which is hereby incorporated by reference in its entirety. Micro-transfer printing using compound micro assembly structures and methods can also be used with the present invention, for example, as described in U.S. patent application Ser. No. 14/822,868, filed Aug. 10, 2015, entitled Compound Micro-Assembly Strategies and Devices, by Bower et al. which is hereby incorporated by reference in its entirety.

According to various embodiments of the present invention, the native source wafer 10 can be provided with the source devices 12, sacrificial layer 52, tethers 56, anchors 58, and source connection posts 17 already formed, or they can be constructed as part of the process of the present invention. In certain embodiments, the source device electrical contact pads 14 are planar electrical connections formed on the process side of the source devices 12 and source wafer 10. Such source device electrical contact pads 14 are typically formed from metals such as aluminum or polysilicon using masking and deposition processes.

The intermediate devices 22 can include active elements such as electronic circuits formed using lithographic processes and can include passive elements such as electrical connections, e.g., wires, to the source device electrical contact pads 14 and intermediate connection posts 26.

Connection posts 17, 26 are electrical connections that extend generally perpendicular to the surface of the source device 12 or intermediate device 22. Such connection posts 17, 26 can be formed from metals such as aluminum, titanium, tungsten, copper, silver, gold, or other conductive metals. The connection posts 17, 26 (as shown in FIGS. 4 and 5) can be formed by repeated masking and deposition processes that build up three-dimensional structures or by using a form. In some embodiments, the connection posts 17, 26 are made of one or more high elastic modulus metals, such as tungsten. As used herein, a high elastic modulus is an elastic modulus sufficient to maintain the function and structure of the connection post 17, 26 when pressed into an intermediate electrical conductor 28, row conductors 32, or column conductors 34 (or electrical contact pads, not shown).

In certain embodiments, the intermediate electrical connections 28 or row and column conductors 32, 34 include patterned metal layers forming electrical contact pads. The electrical contact pads can be made using integrated circuit photolithographic methods. Likewise, the connection posts 17, 26 can be made by etching one or more layers of evaporated or sputtered metal. Such structures can also be made by forming a layers, etching a well into a surface, filling the well with a conductive material such as metal, and then removing the layer.

The connection posts 17, 26 can have a variety of aspect ratios and typically have a peak area smaller than a base area. The connection posts 17, 26 can have a sharp point for embedding in or piercing electrical contact pads. Structures with protruding connection posts 17, 26 generally are discussed in U.S. Pat. No. 8,889,485, referenced above, whose contents are incorporated by reference herein in their entirety.

In micro-transfer printing process, a stamp (e.g., the source stamp or intermediate stamp) includes a plurality of stamp posts (also referred to as pillars) that are pressed against corresponding released components (e.g., source devices 12 or intermediate devices 22) to adhere the components to the stamp posts to transfer the pressed components from the source wafer 10 to the stamp posts. By pressing the stamp against the components, the tethers 56 are broken and the components are adhered to the stamp posts, for example by van der Waal's forces. The stamp is removed from the source wafer 10, leaving the components adhered to the stamp posts.

An optional adhesive layer is coated over the intermediate wafer 20 or destination substrate 30 (the substrate). The stamp is then placed adjacent to the substrate. The components on the stamp posts of the transfer stamp are brought into alignment with the electrical conductors (e.g., row and column conductors 32, 32 or electrical contact pads of the destination substrate 30 or intermediate electrical conductors 28 of the intermediate support 24) and pressed onto or into them by micro-transfer printing with sufficient mechanical pressure against the electrical conductors to drive the connection posts 17, 26 into or through a surface of the electrical conductors to form a robust electrical contact between the connection posts 17, 26 of the component and the substrate electrical conductors. A sufficient mechanical pressure can be an amount of force needed to cause the substrate electrical conductors or connection post 17, 26 to plastically deform as the connection post 17, 26 is pressed into the substrate electrical conductors. Thus, in this embodiment, the connection posts 17, 26 on the components may have sharp points and/or a high elastic modulus, for example, by incorporating tungsten. A connection post 17, 26 can have a sharp point, for example, if the top of the post has an area less than 10 microns square, less than 5 microns square, or less than one micron square. The substrate electrical conductors can also provide adhesion to help adhere the components to the substrate. In an alternative embodiment, the components do not have connection posts 17, 26 but are adhered to the substrate with the adhesive and photolithographic methods are used to form the electrical connections.

The adhesion between the components and the receiving side of the substrate should be greater than the adhesion between the components and the stamp posts of the transfer stamp. Thus, when the transfer stamp is removed from the receiving side of the substrate, the components adhere more strongly to the substrate than to the transfer stamp, thereby transferring the components from the transfer stamp to the receiving side of the destination substrate 30.

The transfer stamp is then removed leaving the components adhered to the substrate. An optional heat treatment can solder or weld the connection posts 17, 26 (if present) of the components to the substrate electrical contacts. Thus, in a further method of the present invention, the substrate electrical contacts (or connection posts 17, 26) are heated, causing the substrate electrical contact metal to reflow and improve adhesion between the components and the substrate and improve the electrical connection to the connection posts 17, 26.

The spatial distribution of the source devices 12 or intermediate devices 22 is a matter of design choice for the end product desired.

The connection posts 17, 26 can be made by pattern-wise etching a forming layer. For example, a silicon 100 wafer can be etched by a combination of dielectric hard masks, photolithography, mask etching, and anisotropic silicon wet etching with, for example KOH or TMAH, or dry etching. A layer of conductive material is deposited, for example with evaporation, e-beam deposition, sputtering, or CVD, and patterned by etching through a patterned photo-resist mask, to form connection posts 17, 26 at least in the form and optionally also on the planar surface of the underlying substrate (e.g., source wafer 10 or intermediate wafer 20) and components (e.g., source device 12) to form electrical conductors (e.g., electrodes 15 or intermediate electrical conductors 28). Soft metals can be used, such as gold, silver, tin, solders, or hard materials such as Ti, W, Mo, Ta, Al, or Cu.

The intermediate wafer 20 or destination substrate 30 (the substrate) for receiving transfer-printed printable components can include a surface on or in which a plurality of non-planar contact pads or electrical conductors are formed and exposed on the surface so that electrical connections can be made to the electrical conductors, such as electrical contact pads. The electrical contact pads can be multi-layer contact pads and can include a layer of solder. Alternatively, the electrical contact pads can be coated with a non-conductive layer or formed on a compliant non-conductive layer, to facilitate electrical connection and adhesion. The non-conductive layer can be a polymer or an adhesive or the compliant non-conductive layer can be a polymer.

A shrinkable material can be disposed in and underfill the volume between the printable component and the substrate. The shrinkable material can be an adhesive and can adhere the printable component and the substrate. By underfill is meant that the shrinkable material does not fill the volume between the printable component and the substrate. Furthermore, with a heat treatment provided after disposing the shrinkable material, the shrinkable material shrinks and provides compression between the printable component and the substrate to further strengthen and make robust the electrical connection between the connection posts 17, 26 and the electrical conductors or contact pads.

According to one embodiment of the present invention, the source wafer 10 can be provided with electronic elements, electrodes 15, and connection posts 17 already formed on the source wafer 10. Alternatively, an unprocessed source wafer 10 can be provided and the electronic elements, electrodes 15, and connection posts 17 formed on the source wafer 10. An unprocessed source wafer 10 is a substrate that does not yet include the electronic elements, electrodes 15, and connection posts 17. The unprocessed source wafer 10 can have other processing steps completed, for example, cleaning, deposition of material layers, or heat or chemical treatments. Source devices 12 are formed, for example using photo-lithographic processes including forming masks over the source wafer 10, etching materials, removing masks, and depositing materials. Using such processes, source devices 12 are formed on or in the source wafer 10.

In some embodiments, the source devices 12 are small integrated circuits formed in a semiconductor wafer, for example gallium arsenide or silicon, which can have a crystalline structure. Processing technologies for these materials typically employ high heat and reactive chemicals. However, by employing transfer technologies that do not stress the source devices 12 or substrate materials, more benign environmental conditions can be used compared to thin-film manufacturing processes. Thus, the present invention has an advantage in that flexible substrates, such as polymeric substrates, that are intolerant of extreme processing conditions (e.g. heat, chemical, or mechanical processes) can be employed for the destination substrates 30. Furthermore, it has been demonstrated that crystalline silicon substrates have strong mechanical properties and, in small sizes, can be relatively flexible and tolerant of mechanical stress.

This is particularly true for substrates having 5-micron, 10-micron, 20-micron, 50-micron, or even 100-micron thicknesses. Alternatively, the components can be formed in a microcrystalline, polycrystalline, or amorphous semiconductor layer.

The source devices 12 can be constructed using foundry fabrication processes. Layers of materials can be used, including materials such as metals, oxides, nitrides and other materials. Each source device 12 can be a complete semiconductor integrated circuit and can include, for example, transistors. The source devices 12 can have different sizes, for example, 1000 square microns or 10,000 square microns, 100,000 square microns, or 1 square mm, or larger, and can have variable aspect ratios, for example 1:1, 2:1, 5:1, or 10:1. The source devices 12 can be rectangular or can have other shapes.

Embodiments of the present invention provide advantages over other methods described in the prior art. By employing connection posts 17, 26 on source devices 12 and intermediate wafers 20 and a printing method that provides connection posts 17 adjacent to the intermediate support 24 or connection posts 26 adjacent to the destination substrate 30, a low-cost method for printing chiplets in large quantities over a destination substrate 30 is enabled. Furthermore, additional process steps for electrically connecting the source devices 12 to the destination substrate 30 are obviated.

The source wafer 10 and source devices 12, source transfer stamp, intermediate wafer 20, intermediate transfer stamp, and destination substrate 30 can be made separately and at different times or in different temporal orders or locations and provided in various process states.

The method of the present invention can be iteratively applied to a single or multiple intermediate wafers 20 or destination substrates 30. By repeatedly transferring sub-arrays of source devices 12 with a transfer stamp to an intermediate wafer 20 or destination substrate 30 and relatively moving the transfer stamp and intermediate wafer 20 or destination substrate 30 between stamping operations by a distance equal to the spacing of the selected source devices 12 in the transferred sub-array between each transfer of source devices 12, an array of source devices 12 formed at a high density on a source wafer 10 can be transferred to an intermediate wafer 20 or destination substrate 30 at a much lower spatial density. In practice, the source wafer 10 is likely to be expensive, and forming source devices 12 with a high density on the source wafer 10 will reduce the cost of the source devices 12, especially as compared to forming components on the destination substrate 30.

In particular, in the case wherein the active source device 12 is an integrated circuit formed in a crystalline semiconductor material, the integrated circuit substrate provides sufficient cohesion, strength, and flexibility that it can adhere to the destination substrate 30 without breaking as the transfer stamp is removed.

In comparison to thin-film manufacturing methods, using densely populated source wafers 10 and transferring source devices 12 to a destination substrate 30 that requires only a sparse array of source devices 12 located thereon does not waste or require active layer material on a destination substrate 30. The present invention can also be used in transferring source devices 12 made with crystalline semiconductor materials that have higher performance than thin-film active components. Furthermore, the flatness, smoothness, chemical stability, and heat stability requirements for a destination substrate 30 used in embodiments of the present invention may be reduced because the adhesion and transfer process is not substantially limited by the material properties of the destination substrate 30. Manufacturing and material costs may be reduced because of high utilization rates of more expensive materials (e.g., the source substrate) and reduced material and processing requirements for the destination substrate 30.

As is understood by those skilled in the art, the terms "over" and "under" are relative terms and can be interchanged in reference to different orientations of the layers, elements, and substrates included in the present invention. For example, a first layer on a second layer, in some implementations means a first layer directly on and in contact with a second layer. In other implementations a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST 10 source wafer
10R red source wafer
10G green source wafer
10B blue source wafer
12 source device/LED
12R red LED
12G green LED
12B blue LED
14 source device electrical contact/pads
15 electrode
16 patterned dielectric material
17 source connection post/spike
18 encapsulation layer
20 intermediate wafer
22 intermediate device
24 intermediate support
26 intermediate connection post/spike
28 intermediate electrical conductor/electrical connection
30 destination substrate/display substrate
32 row conductors
34 column conductors
50 source wafer substrate
52 sacrificial layer
54 sacrificial portion 56 tether
58 anchor
60 intermediate wafer substrate
100 provide source wafer step
105 form micro-transfer printable LEDs step
110 provide intermediate wafer step
115 form micro-transfer printable substrates step
120 provide destination substrate step
125 form electrical conductors step
130 micro-transfer print LEDs onto intermediate wafer step
140 micro-transfer print intermediate devices onto destination substrate step
145 electrically connect intermediate devices on destination substrate step

The invention claimed is:

1. A compound micro-assembled device, comprising:
a destination substrate;
intermediate devices disposed on the destination substrate, each of the intermediate devices comprising an intermediate support smaller than the destination substrate;
source devices disposed on the intermediate support;
intermediate electrical connections disposed on the intermediate support, wherein the intermediate electrical connections electrically connect the source devices disposed on the intermediate support, wherein the intermediate electrical connections have an intermediate resolution; and
destination electrical connections disposed on the destination substrate that electrically connect the intermediate devices, the destination electrical connections having a destination resolution less than the intermediate resolution,
wherein the intermediate electrical connections have an intermediate resolution of less than or equal to 10 microns.

2. The compound micro-assembled device of claim 1, wherein the destination electrical connections have a destination resolution of greater than or equal to 5 microns.

3. The compound micro-assembled device of claim 1, wherein the destination electrical connections have a width or spacing of greater than or equal to 5 microns.

4. The compound micro-assembled device of claim 1, wherein the source devices have at least one of a width, length, and height from 2 to 5 µm, 5 to 10 µm, 10 to 20 µm, or 20 to 50 µm.

5. The compound micro-assembled device of claim 1, wherein the source devices have a substrate thickness of 2 to 5 µm, 5 to 10 µm, 10 to 20 µm, or 20 to 50 µm.

6. The compound micro-assembled device of claim 1, wherein the source devices have an aspect ratio greater than or equal to 2.

7. The compound micro-assembled device of claim 1, wherein the source devices have electrical contact pads disposed adjacent to the ends of the source devices along the length of the source devices.

8. The compound micro-assembled device of claim 1, wherein each source device is a micro-transfer printed source device comprising a broken tether.

9. The compound micro-assembled device of claim 1, wherein each of the intermediate devices is a micro-transfer printed intermediate device comprising a broken tether.

10. The compound micro-assembled device of claim 1, wherein each intermediate devices comprises a source device that is an integrated circuit control chiplet.

11. The compound micro-assembled device of claim 1, wherein one or more of the source devices comprises source connection posts, each of the source connection posts disposed in electrical contact with one of the intermediate electrical connections.

12. The compound micro-assembled device of claim 1, wherein one or more of the intermediate devices comprises intermediate connection posts, each of the intermediate connection posts disposed in electrical contact with one of the destination electrical connections.

13. The compound micro-assembled device of claim 1, wherein the destination electrical connections comprise row conductors and column conductors.

14. The compound micro-assembled device of claim 1, wherein the destination substrate comprises a polymer.

15. The compound micro-assembled device of claim 1, wherein one or more source devices is an integrated circuit.

16. The compound micro-assembled device of claim 1, wherein each of the one or more intermediate devices is a pixel.

17. The compound micro-assembled device of claim 1, wherein the destination substrate is a display substrate.

18. The compound micro-assembled device of claim 1, wherein the intermediate support is an intermediate substrate.

19. A compound micro-assembled device, comprising:
a destination substrate;
intermediate devices disposed on the destination substrate, each of the intermediate devices comprising an intermediate support smaller than the destination substrate;
source devices disposed on the intermediate support;
intermediate electrical connections disposed on the intermediate support, wherein the intermediate electrical connections electrically connect the source devices disposed on the intermediate support, wherein the intermediate electrical connections have an intermediate resolution; and
destination electrical connections disposed on the destination substrate that electrically connect the intermediate devices, the destination electrical connections having a destination resolution less than the intermediate resolution,
wherein the intermediate electrical connections have a width or spacing of less than or equal to 10 microns.

20. The compound micro-assembled device of claim 1, wherein the source devices comprise red light-emitting diodes that can emit red light, green light-emitting diodes that can emit green light, or blue light-emitting diodes that can emit blue light.

21. The compound micro-assembled device of claim 20, wherein each of the intermediate devices comprises a red light-emitting diode, a green light-emitting diode, and a blue light-emitting diode.

* * * * *